US005387885A

United States Patent [19]

Chi

[11] Patent Number: 5,387,885

[45] Date of Patent: Feb. 7, 1995

[54] SALPHASIC DISTRIBUTION OF TIMING SIGNALS FOR THE SYNCHRONIZATION OF PHYSICALLY SEPARATED ENTITIES

[75] Inventor: Vernon L. Chi, Chapel Hill, N.C.

[73] Assignee: University of North Carolina, Chapel Hill, N.C.

[21] Appl. No.: 66,374

[22] Filed: May 25, 1993

Related U.S. Application Data

[63] Continuation of Ser. No. 518,463, May 3, 1990, abandoned.

[51] Int. Cl.[6] .......... H01P 1/213; H03H 7/48

[52] U.S. Cl. .......... 333/100; 333/125; 333/132; 333/136; 327/141; 326/93

[58] Field of Search .......... 333/117, 124–129, 333/132, 134, 136, 100; 307/480, 269, 303.1, 303.2; 364/491

[56] References Cited

U.S. PATENT DOCUMENTS

| | | | |
|---|---|---|---|
| 2,337,184 | 12/1943 | Carter | 333/134 |
| 2,928,963 | 3/1961 | Flood | 333/136 X |
| 3,267,394 | 8/1966 | Peil et al. | 333/136 |
| 3,375,524 | 3/1968 | Kunemund et al. | 333/125 X |
| 3,747,114 | 7/1973 | Shyhalla | 343/853 X |
| 3,764,940 | 10/1973 | Vergnolle | 333/124 |
| 4,599,584 | 7/1986 | Sasser et al. | 333/125 |

FOREIGN PATENT DOCUMENTS

| | | | |
|---|---|---|---|
| 134504 | 8/1983 | Japan | 333/127 |
| 57001 | 2/1990 | Japan | 333/125 |
| 425248 | 9/1974 | U.S.S.R. | 333/128 |
| 497671 | 3/1976 | U.S.S.R. | 333/125 |

OTHER PUBLICATIONS

Staudinger, John; "Wide Bandwidth MMIC Power Dividers: Implementation and a Practical Design Technique"; Microwave Journal; Feb. 1990; pp. 73–90.

Allen L. Fisher and H. T. Kung, "Synchronizing Large VLSI Processor Arrays", *IEEE Transactions on Computers*, vol. C–23, No. 8, Aug. 1985, pp. 734–740.

Kenneth D. Wagner, "Clock System Design", *IEEE Design & Test of Computers*, Oct. 1988, pp. 9–27 & correction Feb. 1989, p. 5.

Stephen Unger & Chung-Jen Tan, "Clocking Schemes for High-Speed Digital Systems", *IEEE Transactions on Computers*, vol. C–35, No. 10, Oct. 1986, pp. 880–895.

(List continued on next page.)

*Primary Examiner*—Benny Lee
*Attorney, Agent, or Firm*—Cushman, Darby & Cushman

[57] ABSTRACT

A method and apparatus is disclosed for providing salphasic distributions of synchronization signals to physically separated entities typically composing a system. Salphasic behavior is a fundamental property of standing waves in any physical situation governed by the wave equation and where the signal is isophasic, i.e., its phase remains constant, over extended regions and abruptly jumps by 180° between adjacent regions. This behavior is used to minimize the phase shifts due to propagation path lengths. A sinusoidal signal is generated and impressed on a distribution medium which is in turn connected to receivers at the various entities to be synchronized. The medium and loads due to the receivers are composed to cause the synchronizing signal to form nearly pure standing waves in the medium. This enables all the entities to receive the synchronizing signal substantially in the same phase to within an ambiguity of exactly 180°, and all the entities within an isophasic region to receive the synchronizing signal in substantially the same phase. Salphasic behavior may be exploited for any geometry of medium, one-, two-, or three dimensional; and is well suited but not restricted to electrical/electronic systems.

56 Claims, 12 Drawing Sheets

OTHER PUBLICATIONS

Eby G. Friedman & Scott Powell, "Design and Analysis of a Hierarchical Clock Distribution System for Synchronous Standard Cell/Macrocell VLSI", IEEE Journal Of Solid-State Circuits, vol. SC-21, No. 2, Apr. 1986, pp. 240-246.

Kenneth D. Wagner & Edward J. McCluskey, "Tuning, Clock Distribution And Communication In VLSI High-Speed Chips" CRC Technical Report No. 84-5 (CSL TN No. 84-247), Jun. 1984, pp. 1-31.

Charles L. Seitz, "Self-Timed VLSI Systems" Caltech Conference On VSLI, Jan. 1979, pp. 345-355.

Ivan E. Sutherland, "Micropipelines", Communications of the AMC, Jun. 1989, vol. 32, No. 6, pp. 720-738.

Charles E. Molnar, "Introducton to Asynchronous Systems", New Frontiers In Computer Architecture Conference Proceedings, pp. 83-94, Mar. 1986.

D. H. Menzel, "Mathematical Physics", Dover Publications, New York, 1961, pp. 182-187.

J. D. Jackson, "Classical Electrodynamics", John Wiley & Sons New York, 1962, p. 183.

R. E. Matick, "Transmission Lines for Digital and Communication Networks", McGraw-Hill, New York, 1969, pp. 45-47.

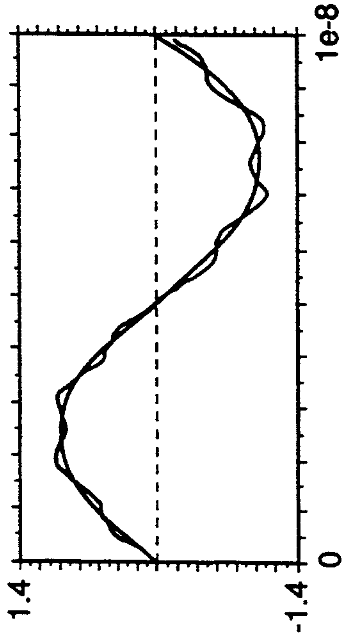
*Fig. 13a1*
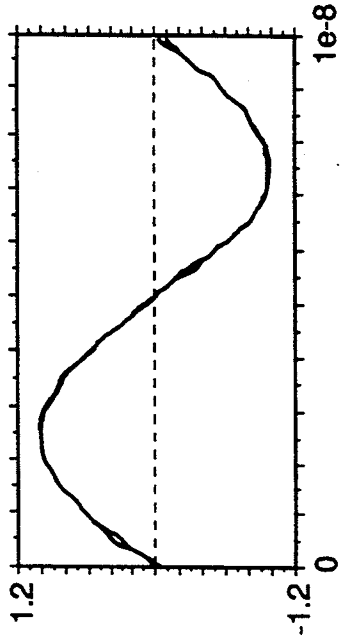
*Fig. 13b1*
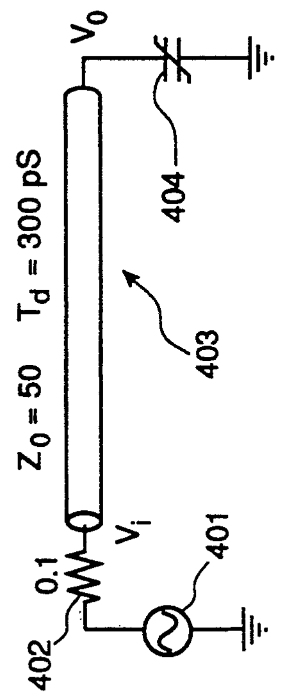
*Fig. 13a2*
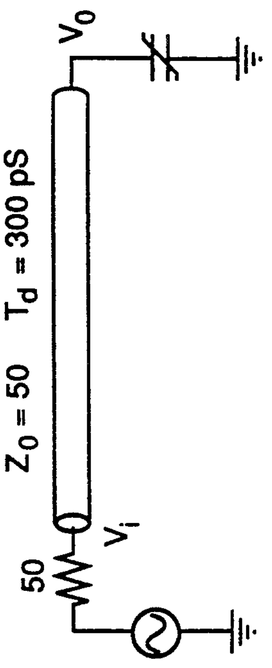
*Fig. 13b2*

Fig. 13d1
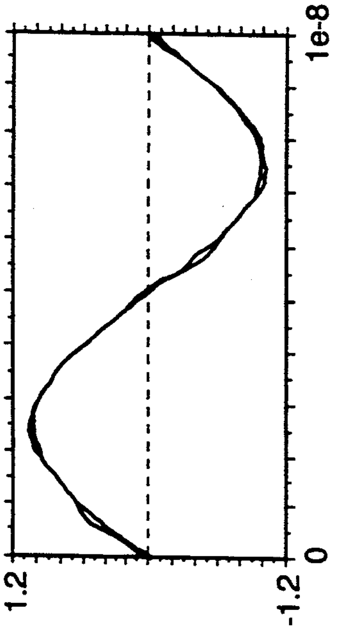
Fig. 13d2
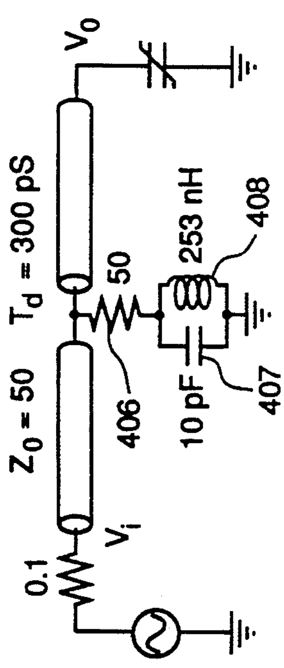
Fig. 13c1
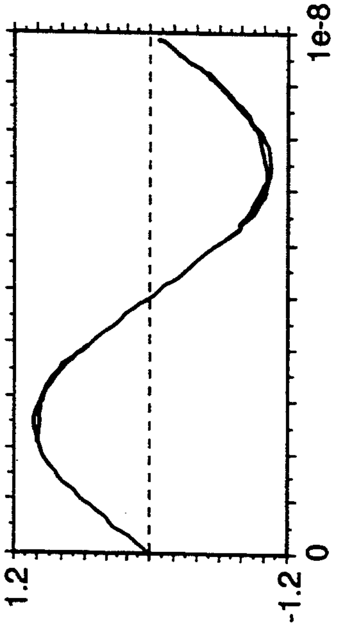
Fig. 13c2
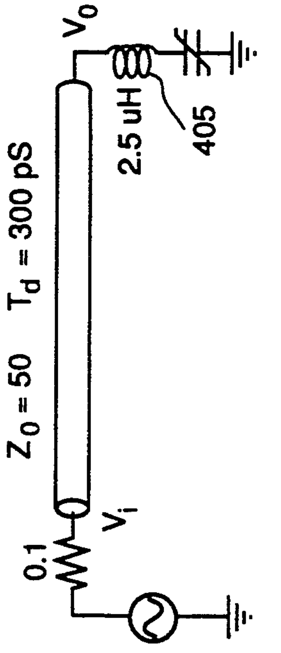

SALPHASIC DISTRIBUTION OF TIMING SIGNALS FOR THE SYNCHRONIZATION OF PHYSICALLY SEPARATED ENTITIES

This is a continuation of application Ser. No. 07/518,463, filed on May 3, 1990, which was abandoned upon the filing hereof.

BACKGROUND OF THE INVENTION

1. Field of the Invention

The present invention relates to a method and apparatus for providing salphasic (characterized by discontinuous progression or abrupt jumps in the advancement of phase with distance) distribution of timing signals for synchronizing the operations of multiple entities, typically composing a system, which are physically separated by distances that would normally cause significant propagation-delay-induced phase shifts. More particularly, the present invention relates to a method for exploiting a salphasic behavior arising from fundamental wave propagation properties to minimize phase differences of timing signals resulting from unequal signal path lengths between a timing signal source and various entities to be synchronized. Yet more particularly, the present invention pertains to application of said salphasic distribution of electrical clock signals to synchronous electronic digital systems.

2. Description of Prior Art

Synchronous system design methodology is well developed and widely used for electronic digital systems. This methodology typically employs rectangular-wave clock and data signals propagated over conductors between communicating modules. To provide clear clock communication, the clock receivers in these modules must be arranged and coordinated with the clock distribution conductors to minimize reflections of the clock signal on these conductors. Therefore, under this design methodology, an important, goal is to impedance match the loads of the clock distribution conductors to eliminate signal reflections.

However, the time delays inherent in the propagation of signals along interconnecting conductors limit the design of synchronous systems. This design limitation becomes increasingly significant as system path lengths grow larger in comparison to the wavelength of the system clock signal. For example, designers need not be too concerned about clock skew (differences in clock phase between various system locations) in systems having relatively small path lengths because clock signals appear nearly in the same phase at all system locations. But for systems having relatively long path lengths, designers must consider clock skew because the phase shifts incurred by the propagation delays along these paths can become an appreciable fraction of the clock cycle and thus may disrupt system operation.

To deal with delay problems, some synchronous system organizations constrain path lengths between communicating modules. However, global clock signals must still propagate across the entire system of modules in a manner that preserves the correct sequence of events throughout the system as discussed in A. L. Fisher and H. T. Kung, "Synchronizing Large VLSI Processor Arrays", IEEE T-C, vol. C-34, no. 8, August 1985. Accordingly, the time delay between communicating modules must not exceed acceptable values, or correct sequencing will be lost. Thus, for large systems containing many modules, clock signal considerations remain important. Moreover, the trend is towards higher clock speeds and more massive systems, both of which increase the need for designers to account properly for these propagation delay limitations.

There are numerous approaches to reduce the variation in clock delays (or the effects thereof) experienced by the system modules, as discussed in K. D. Wagner, "Clock System Design", IEEE Design and Test of Computers, October 1988. One approach is to select a clocking discipline appropriate to the implementing technology to maximize robustness to skew as discussed in S. H. Unger and C-J. Tan, "Clocking Schemes for High-Speed Digital Systems", IEEE T-C, vol. C-35, no. 10, October 1986.

Other approaches tune distribution network conductor lengths and/or amplifier delays to minimize clock skew across the synchronized modules of the system, as discussed for example in Wagner (op.cit.); E.G. Friedman and S. Powell, "Design and Analysis of a Hierarchical Clock Distribution System for Synchronous Standard Cell/Macrocell VLSI", IEEE J-SC, vol. SC-21, no. 2, April, 1986; K. D. Wagner and E. J. McClusky, "Tuning, clock distribution, and communication in VLSI high speed chips", Stanford University CRC Technical Report 84-5, June 1984.

These well proven approaches, however, impose their own constraints on the system design, and in particular they increase the complexity of the design process.

A fundamentally different approach is to abandon altogether the synchronous design methodology in favor of self-timed and asynchronous delay-insensitive disciplines as discussed in C. L. Seitz, "Self-timed VLSI Systems", Proc. Caltech Conference on VLSI, January 1979; C. E. Molnar, "Introduction to Asynchronous Systems", Proc. New Frontiers in Computer Architecture Conference, March 1986; I. E. Sutherland, "Micropipelines", Communications of the ACM, vol. 32 no. 6, June 1989.

These disciplines appear to afford scalability to any system size and speed at the expense of additional hardware. This increases the design effort and ultimate cost of constructing a system and may not be justified for some system speeds and sizes if synchronous alternatives are feasible. Although asynchronous design methodology may some day become the mainstream methodology of choice, it is substantially different from synchronous methodology, and is neither widely understood nor practiced today.

Although each of these approaches (barring the asynchronous technique) effectively reduces the effects of clock propagation delay skew in certain synchronous designs, all fail to provide a simple, uniform design methodology to minimize the actual clock skew in large, high speed, synchronous systems of arbitrary interconnect topology without explicitly addressing the geometric details of the interconnections.

SUMMARY OF THE INVENTION

An object of the present invention is to provide a method for salphasic distribution of timing signals, not necessarily of electrical nature, for synchronizing the operation of various entities typically constituting a system.

Another object of the present invention is to provide an apparatus for salphasic distribution of timing signals for synchronizing the operation of various entities typically constituting a system.

Another object of the present invention is to provide a method for salphasic distribution of clock signals to modules of a synchronous electronic system such that phase shift effects due to the different distribution conductor lengths are minimized.

Yet another object of the present invention is to provide a method for salphasic distribution of clock signals to components of a synchronous electronic system or subsystem using a conducting surface such that phase shift effects at the locations of the various components are minimized.

A further object of the present invention is to provide a method for wireless salphasic distribution of clock signals to the modules of a system contained in a space completely bounded by a conducting surface such that phase shift effects due to the differing locations of the modules are minimized.

To achieve these objects, the present invention exploits a salphasic behavior arising naturally from any purely standing-wave sinusoidal signal in a propagating medium, and the approximation to this behavior by nearly pure standing-wave signals. This behavior provides that within certain regions, the phase of said sinusoidal signal remains everywhere constant. As a result, all entities located within such a region receive the signal in the same phase, and the timing skews resulting from propagation delays are substantially eliminated.

BRIEF DESCRIPTION OF THE DRAWINGS

This behavior is explained in detail for the preferred embodiment, and summarized for the second and third embodiments, illustrated by the following drawings:

FIGS. 13*a*1 through 13*d*2 illustrate harmonic distortion products generated by non-linear loading, and the effect of various methods for coping with them.

DESCRIPTION OF THE PREFERRED EMBODIMENTS

Figure 1A:
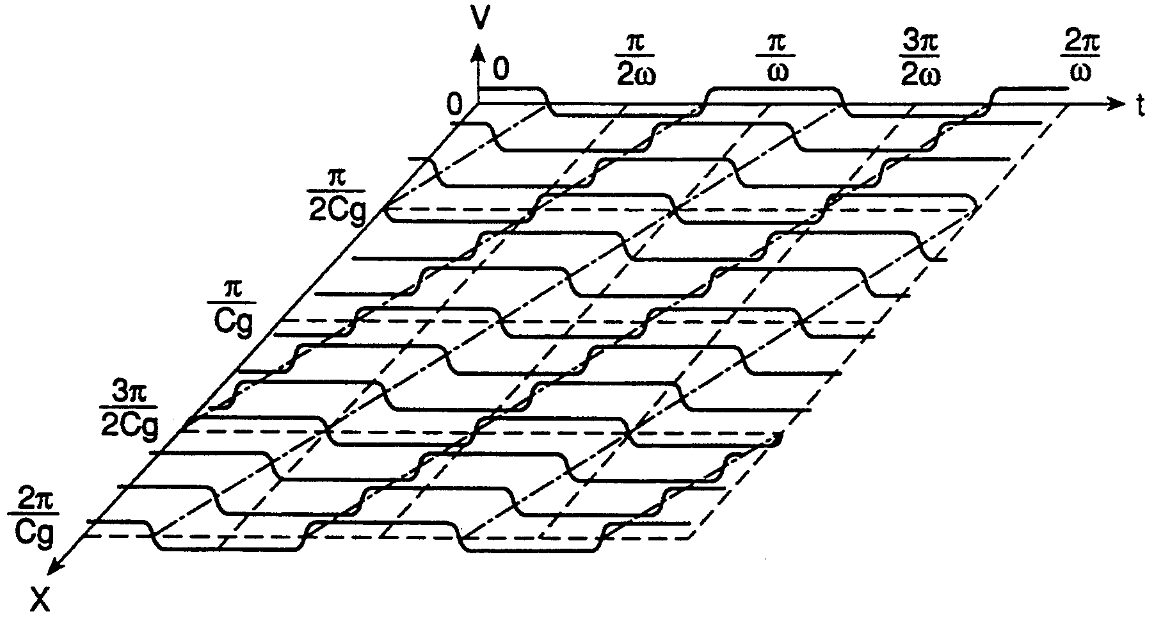
Fig. 1a (PRIOR ART)
FIGS. 1A and 1B graphically depict the difference in behavior between clock signals in prior art systems and salphasic signals according to the present invention.

The first embodiment will be presented in particular detail because it illustrates the salient mechanisms whereby standing waves exhibit salphasic behavior, while being amenable to simple mathematical treatment due to the one dimensional mathematical nature of conventional electrical transmission lines, and the considerable body of prior knowledge applicable thereto.

No such simple, closed form mathematical methods are known for characterizing inhomogeneous wave solutions for the more general two- and three dimensional cases of standing waves with arbitrary boundary condition geometries, although the wave equation $$\nabla^2\psi - \frac{1}{c^2}\frac{\partial^2\psi}{\partial t^2} = -4\pi f(x,t) \quad (1)$$

applies in all cases. This form of the wave equation was taken from p183 of J. D. Jackson, "Classical Electrodynamics", John Wiley & Sons, New York, 1962; however, the physical generality of the wave equation is discussed on p183ff in D. H. Menzel, "Mathematical Physics", Dover Publications, New York, 1961. To analyze all but the most trivial of two- and three dimensional geometries, numerical methods must be used. Various commercial finite-element simulation programs suitable for this purpose are available.

The condition of a pure standing wave leading to salphasic behavior is not restricted to the one dimensional (transmission line) case herein presented in detail. It holds equally well for the two dimensional case of sinusoidal electrical signals propagating across a conducting surface, and the three dimensional case of sinusoidal electromagnetic waves propagating in space. Moreover, it holds equally well for sinusoidal signals of any kind propagating as waves in a suitable medium, e.g. sound waves in air, shear waves in steel, surface waves on water, etc., subject only to the applicability of equation (1). In all cases, purely standing waves exhibit ideal salphasic behavior. Therefore, any composition of matter producing nearly pure standing sinusoidal waves of any description in any sufficiently linear propagating medium of one-, two-, or three-dimensions can be exploited to distribute sinusoidal salphasic timing signals.

Any composition of matter comprising one or more suitably coordinated phase-coherent sinusoidal signal sources driving a sufficiently lossless, sufficiently linear, bounded propagating medium of one-, two-, or three-dimensions with a finite number of sufficiently lossless, sufficiently linear signal loads will produce the desired nearly-pure standing waves; thus, any such composition of matter is seen as useful for the purposes of the present, invention.

That the composition of matter indeed produces nearly pure standing waves regardless of dimensionality can be seen through the following reasoning which considers the case of an ideal lossless linear system driven by a single sinusoidal signal source. Since the system comprises purely linear components, no harmonics are produced from the sinusoidal signal. Therefore, the signal energy in the system is contained exclusively in sinusoidal waves at the signal frequency. In the steady state, no net signal energy is exchanged between the signal source and the system, because the system is bounded and lossless. Thus, in the steady state, the wave propagating away from the source into the medium carries an amount of energy which must be exactly balanced by the amount of energy carried by another wave propagating back towards the source from the medium. The wave equation admits of only two such inhomogeneous solutions, which are identical in all respects except in their opposite directions of propagation. If the energies carried by these two waves are equal, their amplitudes must likewise be equal, thereby ensuring a pure standing wave. This remains true even after an unbounded number of reflections off the loads and boundaries of the system because the two waves are everywhere identical except for opposite directions of propagation. The case of multiple phase-coherent sources, coordinated such that each exchanges no net energy with the medium, follows directly from the superposition principle which universally applies to waves propagating in linear media according to equation (1).

Figure 1B:
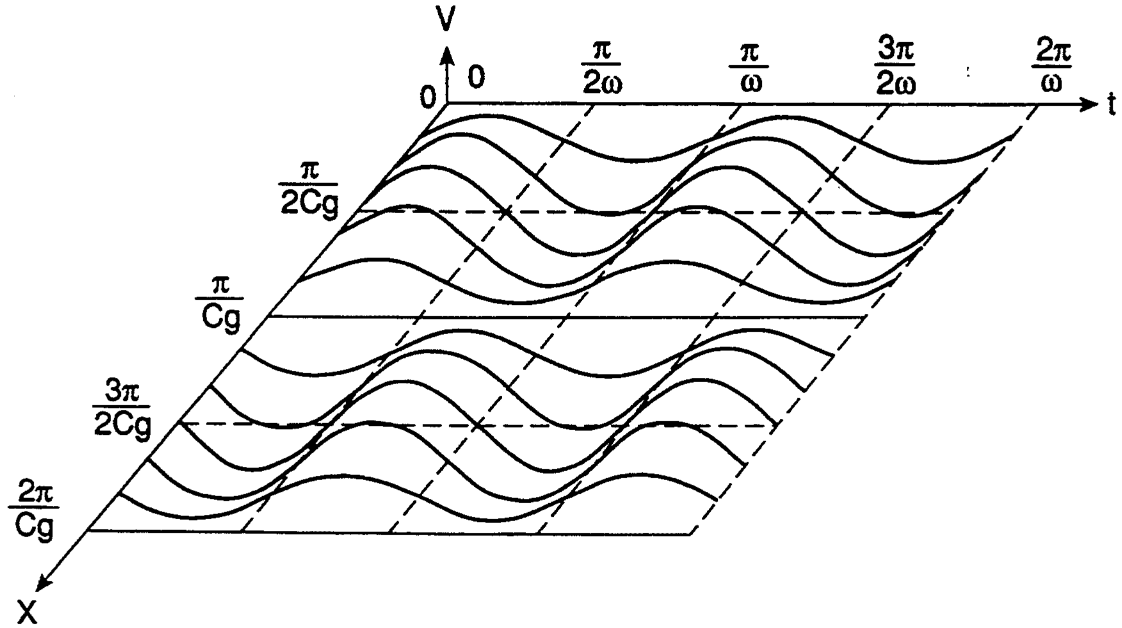
Figure 2:
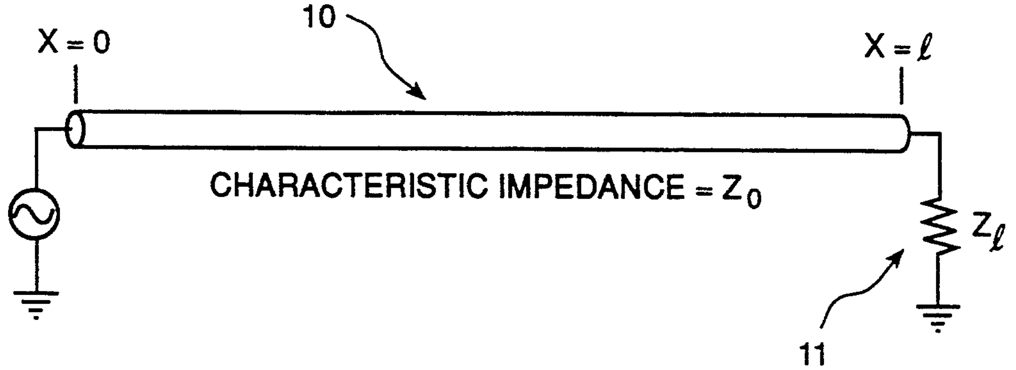
FIG. 2 shows a finite, loaded, uniform electrical transmission line.

This salphasic effect is compared with signals propagated according to prior art in FIGS. 1A and 1B. Both graphs show signal voltage plotted as a function of time t at various locations x along transmission line 10 as depicted in FIG. 2. Prior art methods set impedance $Z_1$ of load 11 to equal a substantially real-valued characteristic impedance $Z_0$ of line 10 and use substantially rectangular-wave signals as illustrated in FIG. 1*a*. In contrast, the present method sets impedance $Z_1$ to a substantially imaginary value $jX_1$ and uses substantially sinusoidal signals as illustrated in FIG. 1*b*.

The phase of the prior art signals in FIG. 1*a* is successively retarded in time for increasing distances x from the driven end of line 10 as illustrated by loci, depicted by the "dash-dot" lines, of the voltage wave zero-crossings. The phase of the salphasic signals in FIG. 1*b* however remains constant for distances $0<x<\pi/c_g$, then abruptly jumps by 180° and again remains constant for distances $\pi/c_g<x<2\pi/c_g$ as shown by coincidence of loci of the voltage wave zero-crossings with constant-time contours $t=n\pi/2\omega$, $n=0 \ldots 4$, depicted by dashed lines.

The nature and underlying physical mechanisms leading to this salphasic behavior is discussed in the following embodiments which will also demonstrate the general and far reaching applicability of the present invention, and its adaptability to any geometry of medium.

First Embodiment: Arbitrary Tree of Branching Transmission Lines

The mechanism whereby salphasic behavior arises from standing waves is described, and the conditions under which a finite loaded transmission line supports standing waves is developed. Then, a canonical branch circuit is described which satisfies these conditions, and is used to show that an arbitrarily branching tree composed of such circuits also satisfies these conditions, thereby demonstrating the salphasic behavior of the entire tree. Simulated examples are shown demonstrating the theory developed herein.

In an infinite lossless uniform linear transmission line, two waves $V_f$ and $V_r$ of equal frequencies propagating in the forward and reverse directions, respectively, are characterized as follows:

$$V_f = V_A \sin\left(\omega t - \frac{x}{c_g}\right), \qquad (2)$$

$$V_r = V_B \sin\left(\omega t + \frac{x}{c_g}\right), \qquad (3)$$

where $V_A$ and $V_B$ represent the amplitudes, $\omega$ represents the angular frequency, t represents time, x represents position along the transmission line, and $c_g$ represents the phase velocity of the waves. Letting $V_B=V_A$ and adding the two waves at location x and time t on the transmission line provides an instantaneous voltage $$V = V_A\left(\sin\left(\omega t - \frac{x}{c_g}\right) + \sin\left(\omega t + \frac{x}{c_g}\right)\right) = 2V_A \sin(\omega t)\cos\left(\frac{x}{c_g}\right). \qquad (4)$$

According to this relationship, the temporal phase $\omega t$ of the instantaneous voltage V is independent of location x, as illustrated in FIG. 1*b*. For any given value of x, only the amplitude of the sinusoidal wave is affected, while the phase remains constant.

This behavior, which I call salphasic, provides that the phase of such a wave distribution is equal for all values of x within any region in which the sign of cos $(x/c_g)$ remains constant. Salphasic behavior depends upon the equality of both the amplitudes and the frequencies of the forward $V_f$ and reverse $V_r$ traveling waves. Such conditions produce a phenomenon known as a pure standing wave wherein the resulting voltage distribution on the transmission line varies sinusoidally in time but appears to remain stationary along the line. Accordingly, any purely standing wave exhibits purely salphasic behavior.

Salphasic behavior is a property exhibited by any lossless, bounded system of conductors and loads driven by a single, or by multiple suitably coordinated phase-coherent sinusoidal sources. In the more realistic case of a slightly lossy system, approximate salphasic behavior is exhibited for limited distances depending upon the degree of lossiness of the system. Accordingly, this behavior may be exploited to minimize the effect that the extent and geometry of the clock distribution conductors have on clock skew.

FIG. 2 shows a finite lossless uniform linear transmission line 10 having characteristic impedance $Z_0$, driven at location x=0, and terminated by a load 11 of impedance $Z_1$, at location x=1. Consider first, if transmission line 10 and load 11 are lossless, then the characteristic impedance $Z_0$ has resistive component $R_0$ but no reactive component, i.e., $Z_0=R_0+j\cdot 0$, and load impedance $Z_1$ has reactive component x, but no resistive component, i.e., $Z_1=0+jX_1$. Accordingly, the voltage reflection coefficient $\rho$ (according to equation 2-64 in R. E. Matick, "Transmission Lines for Digital and Communication Networks", McGraw-Hill, New York, 1969) becomes $$\rho = \frac{Z_l - Z_0}{Z_l + Z_0} = -\frac{R_0 - jX_l}{R_0 + jX_l}, \quad (5)$$

which shows that $|\rho|=1$. This satisfies the desired condition for a purely standing wave wherein the magnitude of the reflected wave $V_B$ is given by $$V_B = |\rho| \cdot V_A = V_A. \quad (6)$$

Therefore, a finite transmission line 10 which is lossless and loaded by a pure reactance 11 produces pure salphasic behavior.

On the other hand, if finite transmission line 10 and load 11 are lossy, in general $Z_0=R_0+j X_0$ and $Z_1=R_1+jX_1$. Along a lossy transmission line, the voltage varies according to the more general relationship (according to equation 2-12 in Matick)

$$V_x = V_A e^{-\gamma x} + V_B e^{\gamma x}, \quad (7)$$

where $V_x$ is the voltage at any given location x, $\gamma=\alpha+j\beta$ is known as the propagation constant having real part $\alpha$ (the attenuation constant) and imaginary part $\beta$ (the phase constant) and $V_A$ and $V_B$ are amplitudes of the forward and reverse waves, respectively. In the situation depicted in FIG. 2, the following boundary conditions apply: At the driven end x=0, $$V_0 = V_A + V_B \quad (8)$$

and at the loaded end x=1, $$\rho = \frac{V_B e^{\gamma x}}{V_A e^{-\gamma x}}. \quad (9)$$

Equations (7) through (9) can be solved for the load voltage, i.e., $V_l=V_x$, x=1:

$$V_l = V_0 \frac{\rho + 1}{\rho e^{-\gamma l} + e^{\gamma l}}. \quad (10)$$

If we let $\rho=e^{(\mu+j\nu)}$ where $\mu$ and $\nu$ are arbitrary parameters introduced as a notational convenience, it is clear that the low-loss load condition $|\rho|\approx 1$ is satisfied by an equivalent condition $\mu\approx 0$. Note also that the low-loss transmission line condition is $\alpha\approx 0$. In the limit as both losses become small, equation (10) becomes $$\frac{V_l}{V_0} = \frac{(\cos(\nu - \beta l) + \cos(\beta l)) + j(\alpha(\sin(\nu - \beta l) - \sin(\beta l)) + \mu \sin(\beta l))}{\cos(\nu - 2\beta l) + 1}. \quad (11)$$

As $\alpha$ and $\mu$ approach zero, the imaginary component becomes negligible showing that in the limit $V_1$ and $V_0$ are nearly salphasic. In particular with $|\rho|=1$, as the real part $\alpha$ of the propagation constant $\gamma$ becomes smaller, salphasic behavior holds for increasingly greater transmission lengths. Thus it follows that a lower loss line can maintain salphasic behavior over greater lengths.

Figure 3:
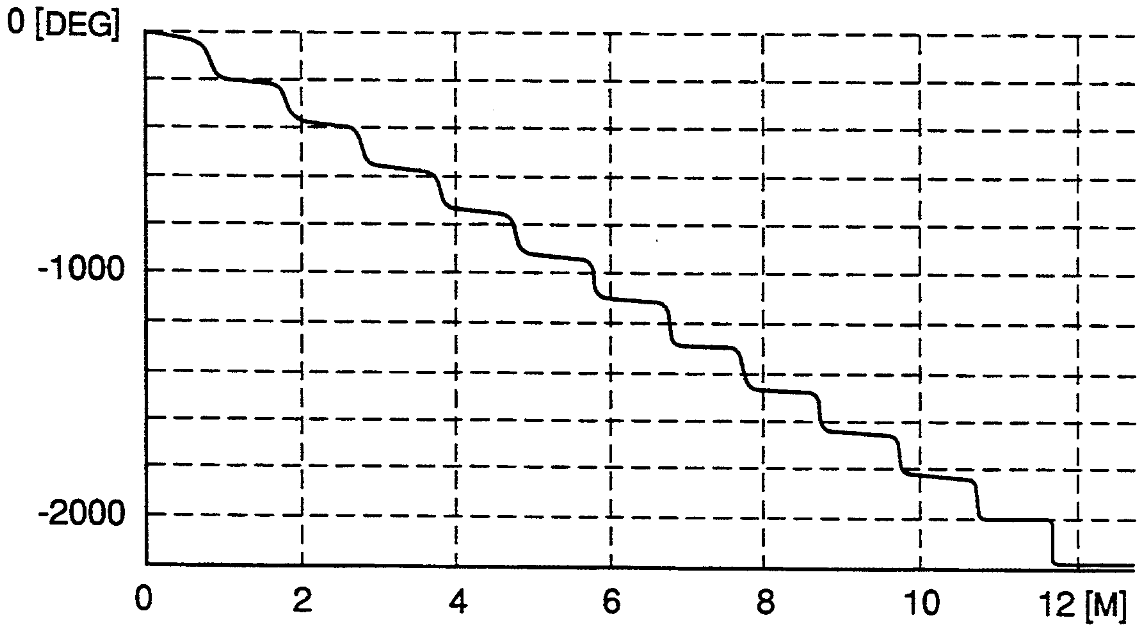
FIG. 3 is a graph showing the phase of a 100 MHz signal along a 12.7 Meter length of RG58/U type coaxial cable (Belden #9201) loaded by a short circuit.

To demonstrate salphasic behavior for a slightly lossy transmission line, a 12.7 Meter length of RG58/U type coaxial cable (Belden #9201) driven by a 100 MHz sine wave and terminated by a short circuit was simulated according to equation (10). FIG. 3 is a graph of the signal phase along the cable, computed from equation (10) as $$\phi = \tan^{-1}(\mathrm{Im}\{V_l/V_0\}/\mathrm{Re}\{V_l/V_0\}), \quad (12)$$

where Im $\{V_l/V_o\}$ is the imaginary part of $V_l/V_o$ and where Re $\{V_l/V_o\}$ is the real part of $V_l/V_o$. Since the short circuit termination dissipates no energy, the reflected, or reverse-traveling wave has the same amplitude as the incident, or forward traveling wave at the termination. This closely satisfies the pure standing wave condition which results in strongly salphasic behavior near the termination. This is illustrated in FIG. 3 by the marked step-like shape of the phase plot near the termination (i.e., the lower right hand portion of the graph). Due to the slight lossiness of the cable, however, the reverse traveling wave decreases in amplitude with increasing distance from the termination, while the forward traveling wave increases in amplitude with increasing distance from the termination (i.e., the forward traveling wave decreases in amplitude with increasing distance from the driving point). Thus the standing wave condition becomes progressively less well satisfied with increasing distance from the termination, resulting in progressively weaker salphasic behavior. This is illustrated in FIG. 3, where the step-like behavior becomes progressively softer with increasing distance from the termination. For a very long cable, the phase-distance plot would approach a purely linear behavior far from the termination. On the other hand, for an ideal lossless cable, a perfectly sharp stair-step phase behavior would persist over the entire length of the cable because the traveling waves would remain of the same amplitude at all locations.

Figure 4:
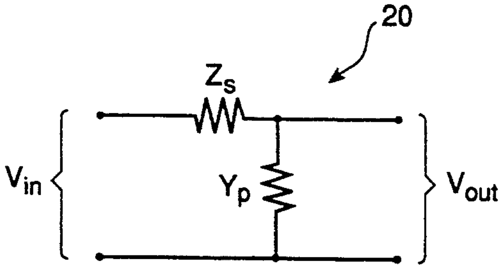
FIG. 4 is a schematic of a lumped constant L-section used to model the load of a section of transmission line.

FIG. 4 shows a lumped constant L-section 20 having input series impedance $Z_s$ consisting of resistive component $R_s$ and reactive component $X_s$, and output shunt admittance $Y_p$ consisting of conductive component $G_p$ and susceptive component $B_p$. Output voltage $V_{out}$ is related to input voltage $V_{in}$ by $$V_{out} = V_{in} \frac{1}{Z_s Y_p + 1}. \quad (13)$$

Under a condition $\mathrm{Im}(Z_sY_p)=0$, the behavior of L-section 20 is salphasic, i.e., $V_{out}$ and $V_{in}$ are of equal or opposite phase. If $Z_s=R_s+jX_s$ and $Y_p=G_p+jB_p$ are nearly lossless, i.e., $R_s<<X_s$ and $G_p<<B_p$, then $Z_sY_p\approx -X_sB_p+jR_sB_p+jX_sG_p$. As $R_s\rightarrow 0$, the second term becomes negligible, and as $G_p\rightarrow 0$, the third term becomes negligible, leaving only the purely real first term. Thus, for nearly lossless $Z_s$ and $Y_p$, a nearly salphasic relationship between $V_{in}$ and $V_{out}$ is maintained.

Figure 5:
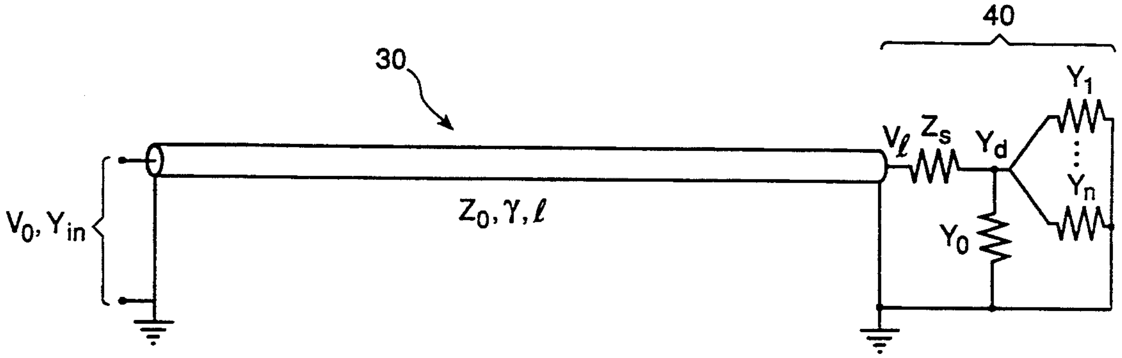
FIG. 5 is a schematic of a canonical branch circuit according to the present invention.

FIG. 5 shows a canonical branch circuit comprising finite linear lossy transmission line 30 loaded by load circuit 40. Transmission line 30 has characteristic impedance $Z_0$, propagation constant $\gamma$, and length l. It is driven with a voltage $V_0$ and presents an input admittance $Y_{in}$ at its driving point. Load circuit 40 comprises a lumped series impedance $Z_s$, a lumped shunt admittance $Y_0$, and the equivalent shunt admittances $Y_1 \ldots Y_n$ presented by n similarly loaded canonical branch circuits connected to $Z_s$.

The equivalent admittances $Y_i$, i>0 are determined using the following formula (derived from equation 2-74 in Matick) for calculating the input admittance presented by a loaded transmission line expressed in terms of its characteristic impedance $Z_0$, its propagation constant $\gamma$, and the reflection coefficient $\rho$ due to its load, $$Y_{in} = \frac{1}{Z_0} \frac{e^{2\gamma l} - \rho}{e^{2\gamma} + \rho}. \quad (14)$$

Hence, the aggregate output shunt admittance connected to $Z_s$ may be represented in terms of the true lumped admittance $Y_0$ and the input admittances $Y_{in}$ of each similarly loaded branch. Thus, load circuit 40 is electrically equivalent to L-section 20 if we let $$Y_p = \sum_{i=0}^{n} Y_i. \quad (15)$$

Combining the finite lossy transmission line characterized by equation (10) and the load circuit characterized-by equation (13) provides a voltage transfer function for the canonical branch circuit depicted in FIG. 5, $$V_d = V_0 \frac{(\rho + 1)}{(Z_s Y_p + 1)(\rho e^{-\gamma l} + e^{\gamma l})}, \quad (16)$$

relating voltage $V_0$ driving this canonical branch circuit with voltage $V_d$ driving the n canonical branch circuits connected thereto.

Under sufficiently lossless conditions, it was shown in equation (11) that $V_0$ and $V_1$ at the ends of transmission line 30 are nearly salphasic, and in equation (13) that $V_1$ and $V_d$ are nearly salphasic; hence, $V_0$ and $V_d$ are also nearly salphasic. Since this holds true for each canonical branch circuit, it holds for all voltages in an arbitrarily branching tree composed exclusively of such canonical branch circuits as shown schematically in FIG. 6. Hence the voltages $V_1$ and $V_d$ at all loads 58 connected either to leaf nodes A or non-leaf nodes B of the branching tree are salphasic with the driving voltage $V_0$ of driving source 62 at the root of the tree and thus with each other.

An arbitrarily branching tree can be represented by successive applications of equation (16). At each leaf, or terminal branch circuit 54 of the tree, there are no $Y_i$ for $i>0$, i.e., $n=0$, and the load is characterized entirely by the true lumped constant L-section comprising $Z_s$ and $Y_0$. Every non-terminal branch circuit 51 or 52 in the tree, including the root node, can be characterized by the general canonical branch circuit described with reference to FIG. 5, with finite or zero valued lumped components $Z_s$ and $Y_0$, as appropriate.

Figure 6:
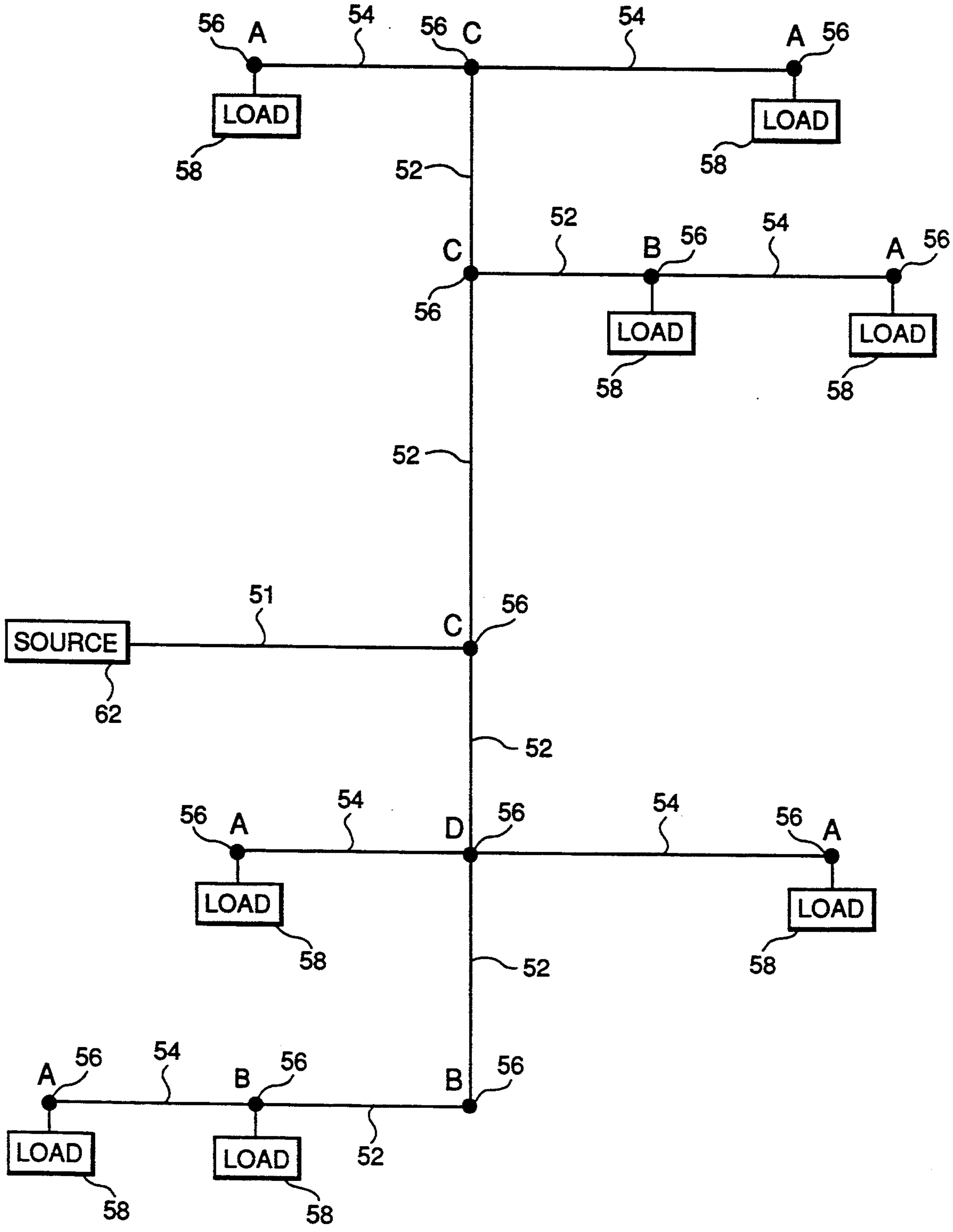
FIG. 6 is a schematic of an example tree-structured clock distribution network.

In FIG. 6, the root branch 51 and all non-terminal branches 52 comprise canonical branch circuits wherein the $Z_s$ for each is (in this case) zero. Actual lumped constant loads 58 may or may not be placed at the output nodes 56 of any canonical branch circuit whether it is a terminal branch 54 or a non-terminal branch 51 or 52. The branching factor at nodes 56 is arbitrary and is shown here to vary from zero to three; for example, the branching factors at nodes A, B, C, and D are 0, 1, 2, and 3, respectively. Terminal branch circuits 54 always have a branching factor of zero, while non-terminal branch circuits 51 and 52 always have a branching factor of at least one. The branching factor is not limited to three, but may be any number, without limit.

As demonstrated in FIG. 6, a tree network designed with salphasic behaving canonical branches provides a salphasic distribution of signals to the loads. Therefore, loads located within the same phase region (i.e., those regions where $\cos(x/c_g)$ of equation (4) is of the same sign) receive the clock signal in the same phase.

The design methodology of the present invention is, therefore, to provide a distribution system which exhibits salphasic behavior. According to this methodology, the following three conditions must be met.

First, the propagating medium (for example, the branches of the tree network shown in FIG. 6) must be substantially lossless and bounded. This promotes pure standing wave characteristics by preventing energy dissipation and leakage.

Second, the source must generate a sinusoidal wave. This condition is different than the sources of prior art distribution systems which may generate rectangular waves.

Third, the loads must be substantially lossless. A substantially lossless, or reactive load will almost completely reflect the sinusoidal wave. On the other hand, loads of the prior art systems are designed to match the impedance of the medium to minimize or eliminate reflection. Accordingly, the design methodology of the present invention eliminates the need for detailed analysis of path lengths and the concern of impedance matching each load.

Figure 7:
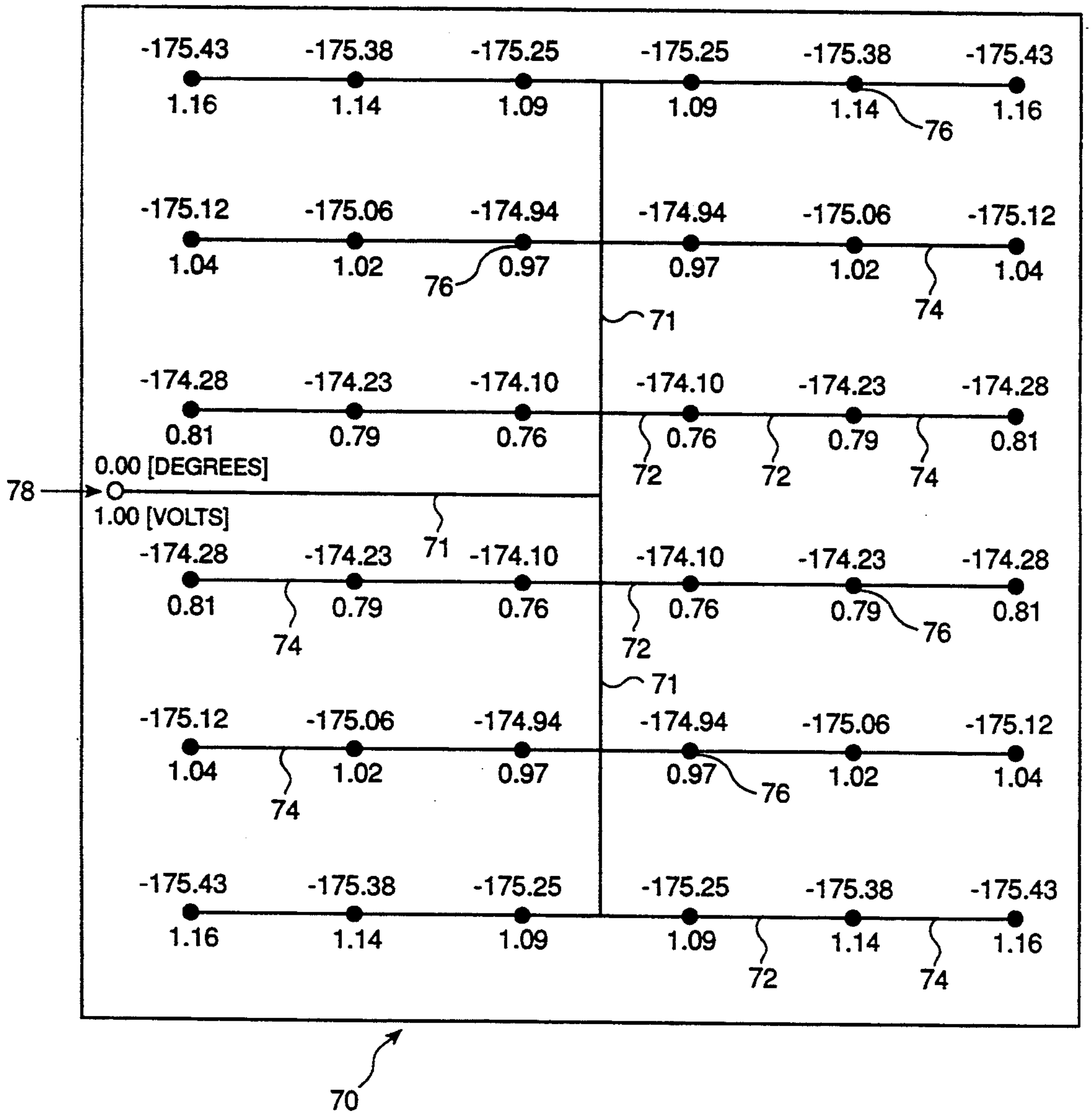
FIG. 7 shows a geometric layout of another example tree-structured clock distribution network realized on a printed circuit board, showing simulated clock signal phase and amplitude at the various loads.

FIG. 7 illustrates a tree distribution network 70 designed according to the present invention. A computer program based upon equation (16) was used to simulate the model tree distribution network 70. The model assumed an 18"×18" standard two sided glass epoxy printed circuit board (PCB) with 2 ounces/square feet copper cladding as the implementation medium for this network. FIG. 7 is substantially to scale, within an accuracy of approximately 5%.

The branch circuit conductors are patterned on one side of the PCB, separated from a ground plane on the other side by 11.8 mils of FR4 dielectric. The simulated clock frequency was 40 MHz. Non-terminal branches 71 were 20 mils wide, while other non-terminal branches 72 and terminal branches 74 were 10 mils wide. The loads at nodes 76, represented by a •, were each 10 pF. The numbers shown adjacent to each load represent the phase and magnitude of the voltage at the load relative to the voltage at root 78, which was set to unit magnitude and zero phase.

As demonstrated by these results, each load at nodes 76 receive the voltage signal in approximately the same phase, even though the distances between root 78 and different nodes vary. For example, the difference between the distances from root 78 to the nearest and farthest nodes from it is about 11". This distance would correspond to over 20° clock skew in prior art systems. However, due to this salphasic distribution of signals, clock skew between loads at nodes nearest to root 78 and loads at nodes farthest from root 78 is a nearly negligible 1.33°.

Moreover, since eliminating signal reflections in a branching tree conductor geometry is infeasible, this topology is not useful for realizing prior art distribution networks. Therefore, prior art systems would require separate conductors to each load, all of the same electrical length, from one or more in-phase clock drivers to achieve similar signal skew performance. This significantly increases the difficulty of the design process.

Accordingly, this first embodiment of the present invention is clearly advantageous to synchronous system design. Since salphasic distribution of clock signals depends solely on maintaining nearly pure standing waves, salphasic behavior may be exploited to control clock skews in all high speed synchronous systems having system path lengths such that sufficiently lossless conditions are preserved. It is therefore possible to build low skew clock distribution networks with minimum attention to adjustments and tuning of path lengths, although further improvement can be achieved by doing so. As exemplified by the model of an 18"×18" PCB shown in FIG. 7, the method according to the first embodiment predicts a clock skew of less than 93 pS between any two loads at a clock frequency of 40 MHz, with no tuning or adjustments whatsoever.

Second Embodiment: Two dimensional Clock Plane

Figure 8A:
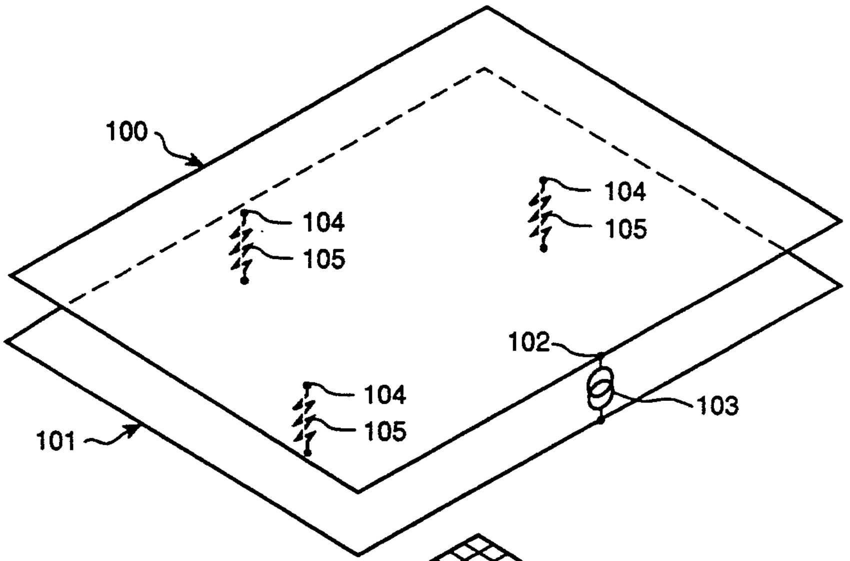
FIG. 8*a* depicts a two dimensional conducting surface over a conducting ground-plane driven and loaded at arbitrary locations.

FIG. 8*a* depicts a second embodiment of the present invention comprising a two dimensional conducting clock plane 100, adjacent and parallel to a conducting ground plane 101, but separated therefrom by a dielectric. Such a structure would be typically realized by two conducting layers of a multilayer printed circuit board. A sine wave generator 103 impresses a sinusoidal voltage at a driving point 102 which may be anywhere on the clock plane. Loads 105 are connected at arbitrary locations 104 to the clock plane, and are low loss so as to reflect energy incident on their input terminals, thus maintaining a nearly pure standing wave condition on the plane, thereby achieving salphasic behavior.

To demonstrate that salphasic behavior is indeed obtained in a lossless plane with lossless loads, simulations were conducted using the CAzM TM program to perform finite element analysis.

Two simulations of the second embodiment depicted in FIG. 8*a* were run with simulated physical parameters for an ideal two-layer PCB and ideal capacitive loads chosen as follows:

| | | |
|---|---|---|
| board dimensions = | 16 × 12 | [inch] |
| dielectric thickness = | 1/16 | [inch] |
| dielectric constant = | 4.5 | [$\epsilon_0$] |
| dissipation factor = | 0 | [1] |
| surface resistivity = | 0 | [Ω/□] |
| load capacitance (ea.) = | 5$^{(FIG.\ 8b)}$, 500$^{(FIG.\ 8c)}$ | [pF] |
| clock frequency = | 50$^{(FIG.\ 8b)}$, 100$^{(FIG.\ 8c)}$ | [MHz] |
| driving point coordinates = | (8, 0) | [inch] |
| load point coordinates = | (2, 4), (6, 10), (12, 6) | [inch] |

The first simulation was run with a clock frequency of 50 MHz and loads set to 5 pF, the second with a clock frequency of 100 MHz and loads set to 500 pF. The resulting simulated voltage distributions across plane 100 are plotted as grids 108 and 109 along with zero-reference planes 110 in FIGS. 8*b* and 8*c*, respectively. A contour 112 is plotted in FIG. 8*c* to indicate the locations where the voltage is zero.

Figure 8B:
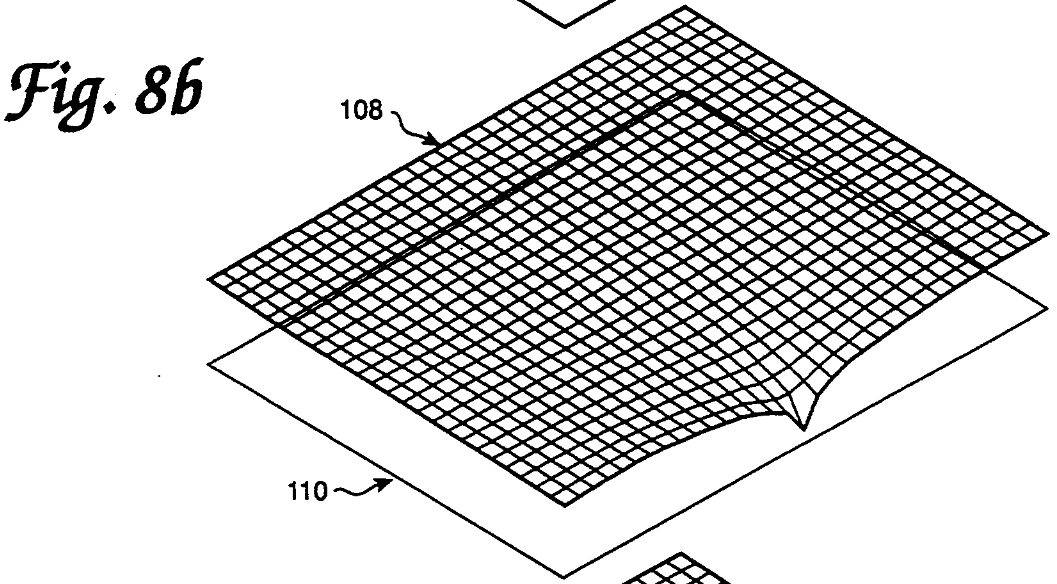
FIG. 8*b* is a 3D graph representing the voltage distribution at 50 MHz on the plane depicted in FIG. 8*a;*

In FIG. 8*b*, the simulated phase is zero everywhere, i.e., identical with the phase of the driving source, to within the numerical accuracy of the CAzM program (better than 1:$10^5$). Also noteworthy is that the amplitude distribution is not significantly affected by the presence of the 5 pF loads at locations 104, as shown in FIG. 8*a*.

Figure 8C:
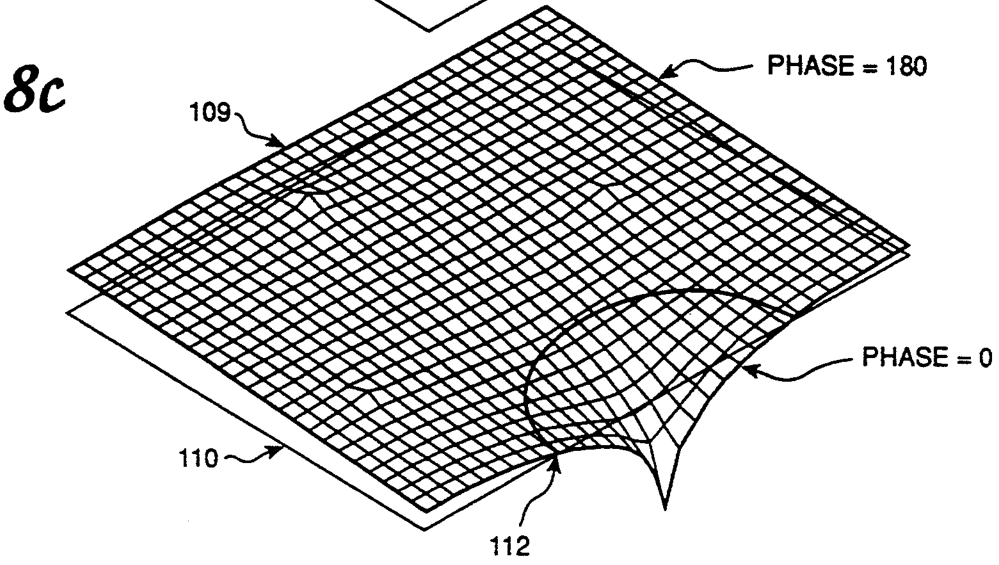
FIG. 8*c* is a 3D graph representing the voltage distribution at 100 MHz on the plane depicted in FIG. 8*a;*

In FIG. 8*c*, two isophasic regions (i.e., regions within which the signal phase remains constant) are apparent, separated by the zero voltage contour 112. To within the numerical accuracy of the CAzM program, the simulated phase everywhere in the region containing the driving point is 0.00°, while the phase everywhere in the second region is 180.00°. Note that the presence of even very large 500 pF loads at locations 104 affects the amplitude at these locations only slightly, as illustrated by minor peaks in the grid 109 at these locations.

Closed-form mathematical solutions to the two dimensional case of the wave equation with arbitrary boundary conditions are generally not possible. Thus, it is not possible to concisely present all the important aspects of salphasic behavior in this embodiment, other than to indicate that all the salient notions of the one dimensional case detailed in the first embodiment may be generalized to the two dimensional case without problems. In particular, the notion of coupled canonical branches generalizes to the notion of multiple constituent surfaces coupled by combinations of auxiliary reactive series and/or shunt loads.

Third Embodiment: Three Dimensional Cavity

Figure 9:
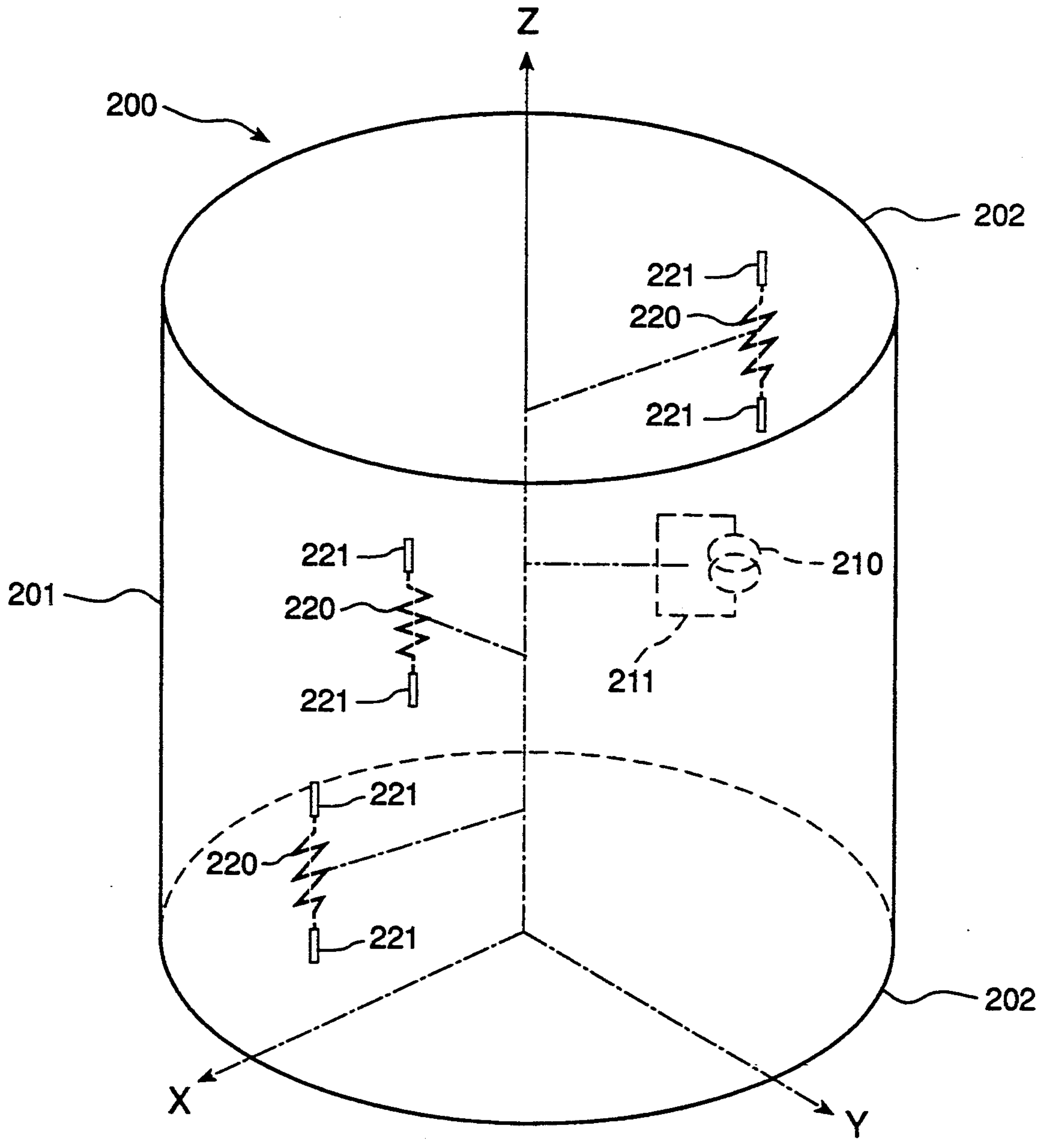
FIG. 9 depicts a three dimensional cavity bounded by conductive walls, driven at an arbitrary internal location, and with arbitrarily located loads.

FIG. 9 depicts a three dimensional cavity 200 completely enclosed by a cylinder 201 and end caps 202 comprising highly conductive, connected surfaces. The cavity 200 is filled with a nearly lossless dielectric medium such as air, and contains a sinusoidal signal source 210 and various nearly lossless receiver loads 220. Source 210 is magnetically coupled to the cavity by its current flowing through conducting loop 211. Loads 220 are arbitrarily placed within the cavity 200, and are electrically coupled to the cavity by signal voltages induced in electric dipole conductors 221.

The resulting electromagnetic wave in the cavity 200 will be strongly salphasic, as will be the signals received at loads 220. Depending on the size and geometry of the cavity 200, the signal frequency, the dielectric constant, and the values of the loads 220, there may be either one or multiple isophasic regions of space in the cavity 200, just as for the one- and two dimensional cases.

This embodiment could be used for wireless synchronization of multiple modules contained in such a cavity, while accruing all the benefits of salphasic behavior resulting from the methodology of the present invention.

As in the two dimensional case, closed-form mathematical solutions to the three dimensional case of the wave equation with arbitrary boundary conditions are generally not possible. Again, however, the notions developed for the first embodiment generalize to this embodiment. Thus, the notion of coupled canonical branches generalizes to the notion of multiple constituent volumes coupled by apertures and other combinations of auxiliary reactive series and/or shunt loads.

Designing Salphasic Distribution Systems

Regardless of its dimensionality, the behavior of a salphasic design can be controlled to a significant degree by use of (discrete) auxiliary loads and/or by modification of the (distributed) properties of the medium itself, both herein treated as auxiliary loading. This control provides mechanisms for optimizing salphasic designs, and extending the methodology.

In the discrete loading case, the auxiliary loads can be in series. i.e., between constituent parts of the propagating medium, or in shunt. The available design variables are the real and imaginary values of the series impedances and shunt admittances of the various auxiliary loads. In the distributed loading case, the available design variables are the real and imaginary values of the series "impedivity" and shunt "admitivity" of the medium.

Varying the real values of the auxiliary loading will affect the purity of the standing waves, while varying the imaginary values will affect the spatial distribution of the standing waveform. Accordingly, the salphasic strength can be enhanced by using negative real valued auxiliary discrete and/or distributed loading. Similarly, the extent(s) and location(s) of isophasic regions can be modified by using imaginary valued discrete and/or distributed loading.

Regenerative Loading

Auxiliary loading with a negative real value contributes energy rather than dissipating it, and thus exhibits a regenerating effect on signals in the loaded medium. It is thereby possible to compensate for lossyness in a system using regenerative loading such that the lossless condition leading to pure salphasic behavior is more closely approximated. In the discrete loading case, each regenerative auxiliary load behaves as if it were a signal source in phase-coherence with the signal incident upon it. In the distributed loading case, the medium itself behaves as a distributed signal source wherein at every location the regenerative energy is in phase-coherence with the signal wave at that location.

Particularly interesting is the case where a salphasic apparatus is regeneratively loaded such that its net losses are zero. Under these conditions, even the existence of the driving source is in principle no longer necessary to sustain an existing salphasic waveform in the medium, because with no losses the signal will not die out over time. In such a case, however, a resonator or other means for controlling the signal frequency is necessary if a single sinusoidal signal is to be maintained.

An apparatus for implementing the discrete regenerative loading is a tunnel diode or any other two-terminal device exhibiting a negative resistance (or conductance) characteristic. Because the negative valued characteristic of any physical device only obtains over a limited range of terminal voltage (or current), all such devices are necessarily non-linear. Thus, to be useful according to the present invention, any such device must be operated with a means to prevent harmonic energy produced by its non-linear characteristics from entering the medium being loaded by the apparatus. This may be accomplished by operating the device within a signal range wherein its negative characteristic is substantially linear. This may also be accomplished by embedding the negative characteristic device in a resonant circuit which in turn is used as a regenerative load. The resonant circuit effectively isolates the harmonic energy generated by the device from the loaded medium, while effectively coupling the device to the loaded medium at the desired frequency.

An apparatus implementing distributed regenerative loading to achieve zero net loss is a maser (herein also intended to include laser) oscillator, wherein the medium and its boundaries are arranged and composed to constitute a resonator within which a standing wave is supported, and the properties of the medium are modified by energy-pumping to be regenerative at the signal frequency, thereby providing a condition where signal losses are neutralized. Thus, a maser oscillator is an instance of a nearly pure salphasic apparatus wherein distributed regenerative loading is utilized to sustain a standing wave without a driving signal source. Therefore, a maser oscillator can be utilized for both the generation and distribution of salphasic timing signals to any location within the extents of its resonator according to the present invention.

Reactive Loading

Auxiliary loading with an imaginary value exchanges no net energy with the loaded medium; however energy is reactively absorbed and returned equally within each signal cycle by such a load. This influences the ratio between the voltage and the current of the standing wave at the load location, resulting in a shift in the position of the standing wave. This effect can be used not only to move the location of an isophasic region, but also to change its extent, as illustrated in FIG. 10c.

Examples of Auxiliary Loading

To quantitatively demonstrate the effects of such loads, simulations were conducted for various cases of discrete loading. These are limited to the one dimensional embodiment for computational convenience, but the principles also apply to the two- and three dimensional embodiments.

Figure 10A:
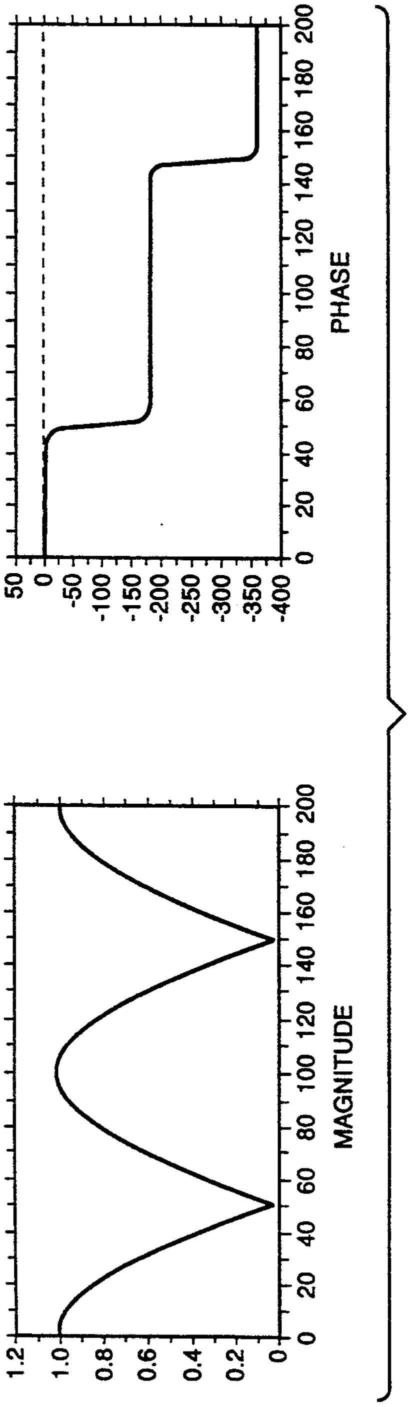
FIG. 10*a* consists of two graphs showing the magnitude and phase of a 100 MHz sinusoidal signal along a 200 cm length of RG58 type coaxial cable.

FIG. 10a shows the magnitude and phase of the voltage along an unloaded 200 cm long RG58 type transmission line driven by a 100 MHz signal. This shows a moderately strong salphasic behavior with three nearly isophasic regions.

Figure 10B:
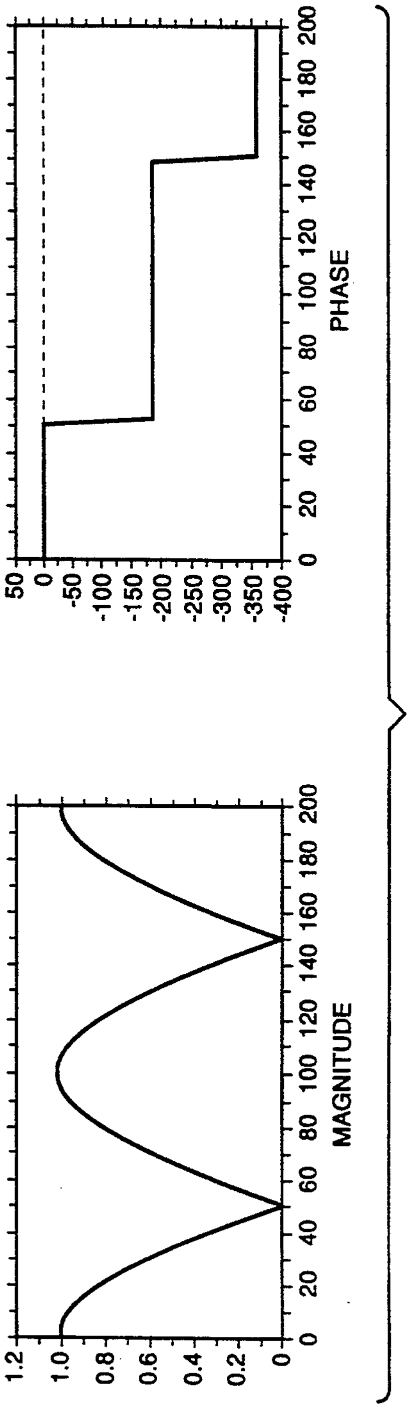
FIG. 10*b* is similar to FIG. 10*a* with the cable loaded at two locations with negative shunt conductances.
Figure 10C:
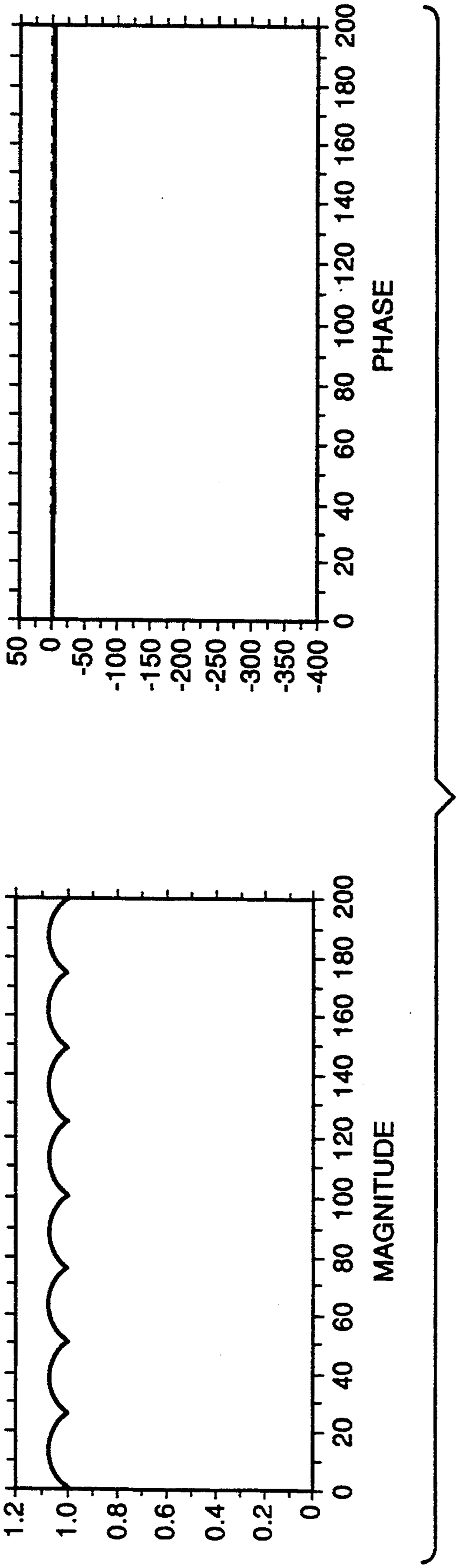
FIG. 10*c* is similar to FIG. 10*a* with the cable loaded at 25 cm intervals with shunt inductances.

FIG. 10b shows the same transmission line as in FIG. 10a with two auxiliary shunt loads. These loads are negative conductances, that is, they are negative real valued admittances which compensate for the slight losses in the cable. One is located in the middle of the line, with a value of $-320$ μSiemens, and the other is located at the undriven end of the line with a value of $-160$ μSiemens. Notice that the salphasic behavior is strengthened dramatically, while the basic voltage wave distribution is affected negligibly.

FIG. 10c shows the same transmission line as in FIG. 10a with one auxiliary shunt load at the undriven end of the line with a value of 210 nil, and 7 auxiliary shunt loads spaced at 25 cm intervals along the line with values of 100 nH each. This purely reactive loading radically modifies the spatial wave distribution along the line, transforming the original three isophasic regions to a single region with less than 1.2° phase shift across it. Moreover, the loaded line shows a voltage magnitude variation of about 10%, while the unloaded line allows a variation from nearly zero to unity.

Isophasic Requirement

Figure 11:
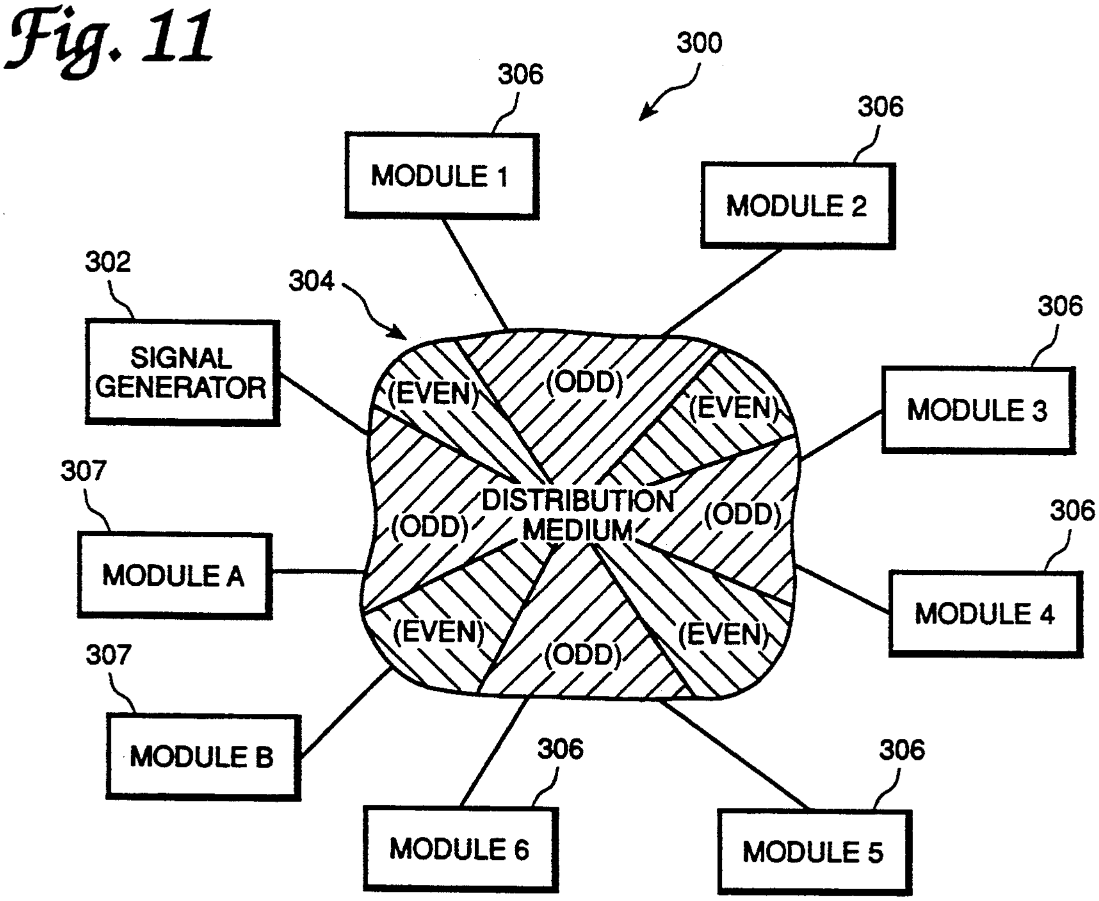
FIG. 11 depicts a synchronous system according to the present invention.

FIG. 11 schematically shows a synchronous system 300 comprising signal generator 302, distribution medium 304 and a plurality of receiving modules 306 and 307. Signal generator 302 generates a sinusoidal signal and distribution medium 304 distributes the signal to various modules 306 and 307. Losslessness and boundedness conditions are satisfied by system 300 such that salphasic behavior is obtained. In general, as shown in the previously described embodiments, multiple isophasic regions are established within which the signal phase remains constant, and between which the signal phase abruptly reverses, i.e., jumps by 180°. This establishes two equivalence classes of isophasic regions, wherein the phase difference between the classes is just 180°, and the signal phase throughout all the regions within each equivalence class is substantially constant. To distinguish between these equivalence classes, they will be referred to as "odd" and "even". The FIG. 11 system can be made completely on an integrated circuit, or parts of the system, such as the individual modules 306, can be made on an integrated circuit.

In practice, of course, there are limitations to the tuning of isophasic regions by use of auxiliary loads. Thus the implementation of some sufficiently large and/or fast systems may not be feasibly contained in a single isophasic region. Nevertheless, the system designer may require a master system clock that is everywhere in phase. Two apparent ways of dealing with the phase reversals between odd and even regions are by a frequency doubling method, and by a method of arranging the receiving modules.

In the arrangement method, the idea is to connect all the receiving modules to the same equivalence class of regions. FIG. 7 illustrates a special case of this where the driving source is, for example, in an odd region wherein the phase is substantially 0°, while all the receiving modules are in an even region wherein the phase is substantially 180°. FIG. 11 further illustrates how a more aggressive design can be accommodated. In this case, distribution medium 304 is sufficiently extended as to have eight isophasic regions. The system modules 306 as well as the signal generator 302 are connected exclusively to odd regions, whereby Modules 1 through 6 in system 300 are isophasic with signal generator 302 and with each other.

Figure 12:
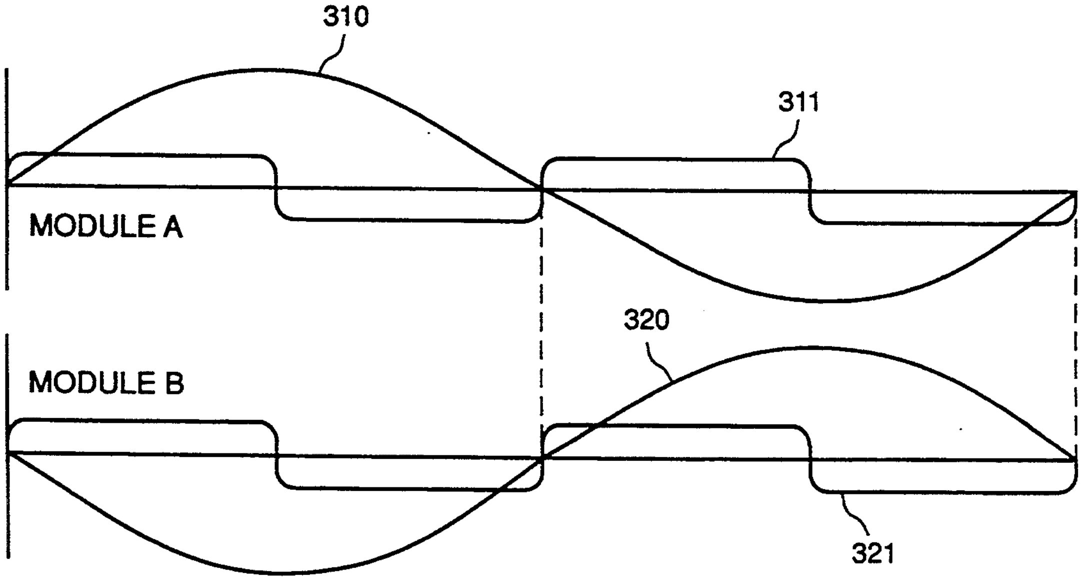
FIG. 12 illustrates an example of modules in adjacent isophasic regions wherein each module locally generates a frequency doubled phase locked signal.

In the frequency doubling method, every module locally generates a (not necessarily sinusoidal) signal of twice the frequency as and in phase lock with the received salphasic signal. Consider modules 307 in FIG. 11. Module A and Module B are connected to odd and even regions, respectively. FIG. 12 depicts the temporal waveforms of salphasic signals 310 and 320 received by Modules A and B, respectively. Each module generates a local signal with its positive-going edge aligned with the positive-going zero crossing of its received salphasic signal, thereby achieving phase lock between its received and generated signals. As a result of frequency doubling, the signals 311 and 321 generated locally in modules A and B, respectively, are in phase with each other. Accordingly, it is possible to provide in-phase clock signals in all modules connected to both odd and even regions by deriving the clock signals from the salphasic signal by phase locked frequency doubling. In principle, this technique can be extended to work by the local generation of phase locked signals having a frequency of any even multiple of the frequency of the salphasic signal.

Harmonic Distortion Products and Interference

Most any real apparatus comprises loads with imperfect linearity, and propagating medium imperfectly bounded such that some interfering signals are coupled into it. Thus, there will always be some undesired signal artifacts, which refer to undesired signal remnants that are interference, propagating in the medium along with the desired salphasic signal. A purely lossless apparatus cannot selectively suppress any artifacts that make their way into the medium.

Two fundamental strategies for dealing with these undesired artifacts and distortion products are preventive and corrective.

Of the preventive techniques, the preferential use of linear medium and loads and bounding the medium to couple minimally with its environment is the first choice.

For electronic systems, propagating media such as coaxial cables or printed circuit boards are readily available which are sufficiently linear. However many otherwise desirable signal receiver circuits exhibit significantly non-linear input impedances. Moreover, regenerative auxiliary loads tend to be fairly non-linear even in a restricted operating voltage range.

FIGS. 13*a*1–13*d*2 illustrate various techniques for dealing with non-linear loads. Simulations were performed corresponding to the schematic representations shown, and the results presented as graphs above each schematic. The input voltage $V_i$ and output voltage $V_o$ of transmission line 403 are plotted as dotted and solid curves, respectively. A single cycle of the signal in the steady state is plotted for each of the four different configurations. The vertical axes represent volts, while the horizontal axes represent seconds.

FIG. 13*a*2 depicts a transmission line 403 driven by signal generator 401 with a resistive source impedance 402 of 0.1 Ω. Generator 401 produces a 100 MHz sine wave with unit amplitude. Line 403 is lossless with a characteristic impedance $Z_o$ of 50 Ω and an electrical delay length $T_1$ of 300 pS. Line 403 is loaded by a purely capacitive non-linear load 404 of approximately 1 pF. The non-linear characteristic of load 404 is similar to that exhibited by many real circuits, but is strongly exaggerated in order to clearly illustrate the effects. Certain harmonic distortion products generated by non-linear load 404 are apparent in the waveform of $V_o$ illustrated in FIG. 13*a*1.

Preventive measures can be taken to minimize the coupling of harmonic distortion products generated by non-linear loads to the propagating medium. One method is to embed the load in a frequency selective coupling circuit such that coupling is strong at the frequency of the desired salphasic signal, but weak at its harmonic frequencies. An example of such an embedding is shown in FIG. 13*c*2. A pure inductor 405 is used to couple load 404 to line 403. Its value is selected such that the salphasic signal operates below the series resonant frequency of the circuit comprising load 404 and inductor 405. The waveform of $V_o$ illustrated in FIG. 13*c*1 is substantially more sinusoidal than in FIG. 13*a*2, illustrating that the harmonic distortion products are effectively isolated from the propagating medium, line 403.

Bounding the medium to minimize coupling between the propagating medium and its environment is not only important to keep unwanted artifacts, which refer to undesired signal remnants that are interference out of the medium, but also to keep the desired signal within the bounded medium: any loss of the desired signal at the boundaries compromises the low loss conditions necessary to approximate a pure standing wave. In the ordinary electrical context, bounding of the medium is tantamount to shielding the conductors. Thus, coaxial transmission lines with tubular extruded, wrapped foil, tight braid, and loose braid outer conductors are examples of successively more poorly bounded propagating media. Moreover, referring to FIG. 8A, it is apparent that this structure, selected for its graphic simplicity, is in fact relatively poorly bounded (although previously postulated to be "ideal" for the purposes exposition), as it can easily exchange electromagnetic energy with its environment. A much higher performance example would sandwich the structure shown in FIG. 8*a* between two shielding planes, each extending sufficiently beyond the edges of the shielded planes to prevent significant edge radiation.

There are two apparent feasible corrective measures to attenuate undesired signals present in the medium. The first is to match the signal source impedance with the impedance presented by the propagating medium at its driving point(s). This condition optimizes energy transfer between the source and the medium. As previously discussed, a lossless medium in the steady state transfers energy back to the source at the same rate as the source transfers energy to the medium, so the net transfer at the desired signal frequency is nil. On the other hand, the ideal source transfers no other energy to the medium whereas any interference or harmonic distortion signal energy incident on the driving point will be absorbed and dissipated by the source impedance. The effect of this method is illustrated in FIG. **13*b*2, where the value of source impedance 402 is set to 50 Ω resistance to match the characteristic impedance of line 403. The improvement in the waveform $V_o$ illustrated in FIG. 13*b*1 over the case of a severely mis-matched source as depicted in the waveform $V_o$ illustrated in FIG. 13*a*1** is readily apparent.

The other corrective method uses frequency selective coupling between a dissipative auxiliary load and the propagating medium. The coupling is arranged such that the dissipative load is effectively isolated from the propagating medium at the signal frequency, while being closely coupled and impedance-matched at selected frequencies corresponding to those of undesired interference and harmonic distortion products. Thus, the desired signal is substantially unaffected while the interference and distortion products in the selected frequencies are absorbed and dissipated in the auxiliary load. FIG. **13*d*2 depicts such a load comprising resistor 406, capacitor 407, and inductor 408, arbitrarily connected to the mid point of transmission line 403. The values of capacitor 407 and inductor 408 are selected to resonate at the frequency generated by source 401. Again a marked improvement in the waveform of $V_o$ illustrated in FIG. 13*d*1 is apparent relative to that in FIG. 13*a*1**.

Conclusion

As exemplified by these three embodiments, the present invention is a powerful method for distributing synchronizing signals with low phase skew between the various locations of use. Systems incorporating salphasic designs for synchronizing signal distribution need not be as concerned with problems arising from propagation delays as do conventional clock distribution system designs. Moreover, salphasic distribution systems can exploit very general geometries of distribution media which conventional systems cannot.

It is to be understood that the present invention is not limited to the disclosed embodiments, but is intended to cover various modifications and equivalent arrangements included within the spirit and scope of the appended claims. For example, one example of a propagating medium for an electromagnetic wave in an integrated circuit is a superconducting connection. An example of a receiver of an electromagnetic wave is the input circuitry of an integrated circuit.

I hereby claim the following:

1. An apparatus for distributing a sinusoidal signal comprising:

means for generating said sinusoidal signal with a first temporal phase $\phi_g$;

means for receiving the signal with a specific second temporal phase $\phi_i$, said receiving means being substantially energy lossless; and means for propagating the signal, said propagating means being substantially energy lossless, having a substantially energy lossless finite boundary, having a geometry independent of a wavelength of said sinusoidal signal, and coupled to said generating and receiving means to cause said sinusoidal signal to propagate through said propagating means to form a standing wave so that said specific second temporal phase $\phi_i=\phi_g+\delta_i-n_i\times 180°$ at said receiving means, where $\delta_i$ is a small, location-dependent phase offset, and $n_i$ is a location-dependent non-negative integer.

2. An apparatus according to claim 1 wherein said standing wave forms at least one region in the propagating means in which a general second temporal phase $\phi$ of the sinusoidal signal is $\phi=\phi_g+\delta-n\times 180°$, where n is a non-negative integer, and $\delta$ is a small, location-dependent phase offset, and wherein said specific second temporal phase $\phi_i$ is a value of $\phi$ at a location corresponding to each of said receiving means.

3. An apparatus according 2, wherein said receiving means comprises a plurality of receiving modules coupled exclusively within said one region that occurs in the propagating means so that said plurality of modules receive said sinusoidal signal in substantially the same phase.

4. An apparatus according to claim 3, further comprising an auxiliary load means coupled to said propagating means for modifying a shape and a position of said standing wave, thereby adjusting an extent and a location of said one region.

5. An apparatus according to claim 2, wherein said at least one region comprises a plurality of regions in said propagating means such that in each of said plurality of regions there occurs said general second temporal phase $\phi=\phi_g+\delta-n\times 180°$ of the sinusoidal signal, where $\delta$ is caused by energy losses in the propagating means, at the boundary of the propagating means, and in the receiving means; and wherein said receiving means comprises a plurality of receiving modules, each of said receiving modules coupled to one of said plurality of regions in the propagating means, wherein the sinusoidal signal is received by each of said modules with a specific second temporal phase $\phi_i=\phi_g+\delta_i-n_i\times 180°$ where $\delta_i$ is a value of $\delta$ at each of said modules and $n_i$ is a value of n at each of said modules.

6. An apparatus according to claim 5, further comprising an auxiliary load means coupled to said propagating means for modifying a shape and a position of said standing wave, thereby adjusting extents and locations of said plurality of regions.

7. An apparatus according to claim 5, wherein said receiving modules are coupled to said propagating means in particular regions of said plurality of regions such that n is one of an odd and an even integer throughout all of said particular regions;

whereby the modules receive the signal in one of an odd and even specific second phase $\phi_i=\phi_g+\delta_i--j_i\times 180°-k_i\times 360°$ where $j_i=0$ when $n_i$ is even, $j_i=1$ when $n_i$ is odd, and $k_i=(n_i-j_i)/2$ is a non-negative integer; and wherein each said one specific second phase is equivalent to a phase $\phi'_i=\phi_g+\delta_i-j_i\times 180°$.

8. An apparatus according to claim 5, wherein said receiving modules further comprise local generating means for generating local timing signals in uniform phase lock with the sinusoidal signal received by the modules;

whereby said local timing signals are all of a frequency which is a positive integer m times a frequency of the sinusoidal signal received by the modules; and whereby said local timing signals are all in a specific phase relationship to the sinusoidal signal received by the modules.

9. An apparatus according to claim 8, wherein said positive integer m is an even integer, whereby said local timing signals in each of said modules are in substantially a same phase.

10. An apparatus according to claim 1 wherein undesired interference signals occur in said medium and further comprising:

frequency selective coupling means which isolates at a selected frequency of said sinusoidal signal and couples at frequencies of undesired interference signals; and dissipative load means coupled by said frequency selective coupling means to said propagating means for dissipating said undesired interference signals.

11. An apparatus according to claim 1, wherein said generating means comprises a means for generating synchronous electrical clocking signals and wherein said generating means is coupled to said propagating means by at least one of direct electrical conduction, magnetic field coupling, and electric field coupling.

12. An apparatus according to claim 11, wherein said receiving means is coupled to said propagating means by at least one of direct electrical conduction, magnetic field coupling, and electric field coupling.

13. An apparatus according to claim 11, wherein said propagating means comprises a combination of curvilinear conductors interconnected in three dimensional space at locations different from said generating means, each conductor having a length, wherein one dimensional electromagnetic wave propagation is supported along the lengths of said conductors.

14. An apparatus according to claim 13, wherein a topology of said curvilinear conductors is a tree network.

15. An apparatus according to claim 13, wherein said propagating means comprises superconducting interconnection means in an integrated circuit.

16. An apparatus according to claim 11, wherein said propagating means comprises an interconnected combination of conducting surfaces in three dimensional space, each surface having an area, wherein two dimensional electromagnetic wave propagation is supported across the areas of said conducting surfaces.

17. An apparatus according to claim 16, wherein the conducting surfaces comprise conductor layers of a multilayer printed circuit board.

18. An apparatus according to claim 17, wherein the electromagnetic wave propagating on said conductor layers is received in a differential signal mode.

19. An apparatus according to claim 17, wherein the electromagnetic wave propagating on said conductor layers is received in a single-ended signal mode.

20. An apparatus according to claim 19, wherein a single-ended signal reference layer of said conductor layers is one of a power plane and a ground plane.

21. An apparatus according to claim 17, wherein the conductor layers are shielded on at least one side by at least one further conductor layer of the printed circuit board.

22. An apparatus according to claim 21, wherein said at least one further conductor layer is at least one of a power plane and a ground plane.

23. An apparatus according to claim 1, wherein said receiving means comprises input circuitry of an integrated circuit.

24. An apparatus according to claim 11, wherein said propagating means comprises a dielectric filled cavity having a volume completely bounded by an interconnected combination of conducting surfaces, wherein three dimensional electromagnetic wave propagation is supported throughout the volume of said cavity.

25. An apparatus according to claim 11, wherein said propagating means comprises an interconnected combination of curvilinear conductors having a length and conducting surfaces having an area in three dimensional space, wherein electromagnetic wave propagation is supported as one dimensional electromagnetic wave propagation along the lengths of said curvilinear conductors and as two dimensional electromagnetic wave propagation across the areas of said conducting surfaces.

26. An apparatus according to claim 1, wherein said receiving means further comprises frequency selective coupling means for coupling a selected frequency of said sinusoidal signal to said propagating means and isolating distortion frequencies of said sinusoidal signal.

27. An apparatus according to claim 1, further comprising a regenerative load means for adding energy, phase-coherent with said sinusoidal signal, to said propagating means to compensate for energy losses of said sinusoidal signal.

28. An apparatus according to claim 27, wherein said regenerative load means further comprises frequency selective coupling means for coupling a selected frequency of said sinusoidal signal to said propagating means and isolating distortion frequencies of said sinusoidal signal.

29. An apparatus according to claim 1, further comprising:

frequency selective coupling means which isolates at a selected frequency of said sinusoidal signal and couples at distortion frequencies of said sinusoidal signal; and dissipative load means coupled by said frequency selective coupling means to said propagating means for dissipating said distortion frequencies.

30. An apparatus according to claim 1, wherein said generating means and said propagating means are coupled to minimize reflections of energy and whereby unintentional interference signals and distortion products in the propagating means are absorbed by the generator means.

31. A method of distributing a synchronous sinusoidal clock signal in an electronic system containing a plurality of modules, each module having a substantially reactive electrical input, comprising the steps of:

forming a substantially dissipationless electromagnetic propagating medium having a geometry independent of a wavelength of said sinusoidal signal with a substantially energy lossless finite boundary;

coupling the substantially reactive electrical inputs of said plurality of modules to the medium at a plurality of first locations;

generating a sinusoidal electrical clock signal with a first temporal phase $\phi_g$; and coupling the clock signal to the medium at a second location so that each of said plurality of modules receives the clock signal with a second temporal phase $\phi_i=\phi_g+\delta_i-n_i\times 180°$, where n, is a non-negative integer, and $\delta_i$ is a small location-dependent phase offset caused by energy loss at the boundary and by dissipation in the medium and in the inputs.

32. A method for providing a sinusoidal timing signal to a plurality of modules, each module having a substantially energy lossless input, comprising the steps of:

forming a substantially energy lossless propagating medium having a geometry with a substantially energy lossless finite boundary;

coupling said substantially energy lossless input to the medium at a plurality of first locations;

generating a sinusoidal timing signal; and coupling said sinusoidal timing signal to said medium at a second location in the medium so that said timing signal forms a substantially pure standing wave having a wavelength independent of said geometry and thereby establishes regions in the standing wave within which the timing signal remains in substantially constant phase and between said regions the signal phase abruptly shifts substantially 180° thereby providing said timing signal to each of the modules coupled to the medium.

33. A method for distributing a sinusoidal signal to a plurality of spatially separated entities, each entity having a substantially energy lossless input, comprising the steps of:

forming a substantially energy lossless propagating medium having a geometry with a substantially energy lossless finite boundary;

coupling the medium to each of said substantially energy lossless inputs of said entities;

generating said sinusoidal signal with a first temporal phase $\phi_g$; and coupling said sinusoidal signal to the medium to cause said sinusoidal signal to propagate through the medium to form a substantially pure standing wave due to said substantially energy lossless propagating medium and said substantially energy lossless inputs, said standing wave having a wavelength independent of said geometry, and being received with a specific second temporal phase $\phi_i$ at each of said substantially energy lossless inputs, wherein each of said specific second temporal phases $\phi_i$ corresponding to said substantially energy lossless inputs is $\phi_i=$100 $_g+\delta_i-n_i\times 180°$, where $\delta_i$ is a small, location-dependent phase offset, and $n_i$ is a location-dependent non-negative integer.

34. A method according to claim 33, further comprising the step of coupling at least one regenerative load to the medium at a second discrete location to supply regenerative energy that compensates for energy losses in the medium.

35. A method according to claim 34, wherein said step of coupling said regenerative load comprises the steps of:

coupling the regenerative load to a frequency-selective resonator, resonant at a frequency of said sinusoidal signal; and coupling the resonator to the medium at said second location to sustain the energy of said sinusoidal signal at the resonant frequency of the resonator.

36. A method according to claim 33, wherein said step of coupling said sinusoidal signal to the medium comprises the step of coupling said sinusoidal signal to the medium at a discrete location.

37. A method according to claim 36, wherein said step of coupling the medium to the inputs comprises the step of coupling at least one of said inputs at said discrete location.

38. A method according to claim 33, wherein said step of coupling said medium to said inputs comprises the step of coupling a substantially linear input to said medium at each of said entities to minimize distortion of said sinusoidal signal in the medium.

39. A method according to claim 33 wherein the step of coupling the medium to said inputs comprises the steps of:

forming a plurality of frequency selective coupling devices, each coupling device coupling at a frequency of said sinusoidal signal and isolating at frequencies of distortion of said sinusoidal signal; and coupling the medium to each of said inputs through a respective one of said plurality of frequency selective coupling devices to isolate distortion products and minimize distortion of the sinusoidal signal in the medium.

40. A method according to claim 33, wherein said signal generating step uses a signal generator that minimizes reflections of energy at a coupling interface between the generator and the medium and wherein said generator absorbs unintentional distortion products occurring in the medium through the coupling interface to minimize distortion of the sinusoidal signal in the medium.

41. A method according to claim 33, further comprising the step of coupling to the medium at least one auxiliary load which is substantially energy lossless at a frequency of the sinusoidal signal and substantially energy dissipating at frequencies of a distortion of the sinusoidal signal to minimize distortion of the sinusoidal signal in the medium.

42. A method according to claim 33, wherein undesired interference signals occur in said medium and wherein said signal generating step uses a signal generator that minimizes reflections of energy at a coupling interface between the generator and the medium and wherein said generator absorbs said undesired interference signals occurring in the medium through the coupling interface to minimize said interference signals in the medium.

43. A method according to claim 33 wherein undesired interference signals occur in said medium and further comprising the step of coupling to the medium at least one auxiliary load which is substantially energy lossless at a frequency of the sinusoidal signal and substantially energy dissipating at frequencies of undesired interference signals occurring in the medium to minimize said undesired interference signals in the medium.

44. A method according to claim 33, wherein said step of coupling said sinusoidal signal to the medium comprises the step of coupling said sinusoidal signal to the medium continuously over at least one finite geometric zone in the medium.

45. A method according to claim 33, further comprising the steps of coupling at least one spatially distributed regenerative load to the medium continuously over at least one finite geometric zone in the medium to supply regenerative energy that compensates for energy losses in the medium.

46. A method according to claim 45, further comprising the step of coupling a frequency-selective resonator, resonant at a frequency of said sinusoidal signal, to the medium over a finite geometric zone to sustain energy of said sinusoidal signal at the resonant frequency of the resonator.

47. A method according to claim 45, further comprising the step of coupling a frequency-selective resonator, resonant at a frequency of said sinusoidal signal, to the medium at a discrete location to sustain energy of said sinusoidal signal at the resonant frequency of the resonator.

48. A method according to claim 33, further comprising the steps of:

locally generating, within each of the entities, a second signal, such that said second signal has a frequency which is a positive integer m times a frequency of said sinusoidal signal; and uniformly phase locking, within each of said entities, the second signal to the sinusoidal signal so that said locally generated second signal is substantially in a specific phase relationship to said sinusoidal signal.

49. A method according to claim 48, wherein said positive integer m is an even integer, whereby said second signals within each of said entities is in substantially a same phase.

50. A method according to claim 33 wherein said standing wave forms at least one region in the medium in which a general second temporal phase $\phi$ of the sinusoidal signal is $\phi=\phi_g+\delta-n\times180°$, where n is a non-negative integer, and $\delta$ is a small, location-dependent phase offset, and wherein said specific second temporal phase $\phi_i$ is a value of $\phi$ at a location corresponding to each of said inputs.

51. A method according to claim 50, further comprising the step of coupling to the medium at least one substantially energy lossless auxiliary load to modify a spatial shape of said standing wave in the medium and thereby control a size of said at least one region in the medium.

52. A method according to claim 50, further comprising the step of coupling to the medium at least one substantially energy lossless auxiliary load to modify a spatial position of said standing wave in the medium and thereby control a location of said at least one region in the medium.

53. A method according to claim 50, further comprising the step of coupling the inputs of said plurality of spatially separated entities to the medium such that all of the inputs are coupled exclusively within only said at least one region so that all of the inputs receive the sinusoidal signal in substantially the same temporal phase.

54. A method according to claim 50, wherein said at least one region comprises a plurality of regions and further comprising the step of coupling the inputs of said plurality of spatially separated entities to a first group of said plurality of regions in which n is one of an odd and an even number so that each said input receives the sinusoidal signal in one of an odd and even specific second temporal phase $\phi_i=\phi_g+\delta_i-j_i\times180°-k_i\times360°$, where $\delta_i$ is a value of $\delta$ at said input, $n_i$ is a value of n at said input, $j_i=0$ when $n_i$ is even, $j_i=1$ when $n_i$ is odd, and $k_i=(n_i-j_i)/2$ is a non-negative integer, and wherein said one specific second temporal phase $\phi_i$ is equivalent to a phase $\phi'_i=\phi_g+\delta_i-j_i\times180°$.

55. A method according to claim 33, wherein said step of coupling said sinusoidal signal to the medium comprises the step of coupling said sinusoidal signal to the medium at a plurality of discrete locations.

56. A method according to claim 55, wherein said step of coupling the medium to the inputs comprises the step of coupling at least one of said inputs to at least one of said plurality of discrete locations.

* * * * *